(12) United States Patent
Loh et al.

(10) Patent No.: US 9,309,124 B2
(45) Date of Patent: *Apr. 12, 2016

(54) METHODS OF FORMING GRAPHENE BY GRAPHITE EXFOLIATION

(75) Inventors: Kian Ping Loh, Singapore (SG); Junzhong Wang, Singaore (SG)

(73) Assignee: National University of Singapore, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/806,713

(22) PCT Filed: Jun. 24, 2011

(86) PCT No.: PCT/SG2011/000225
§ 371 (c)(1),
(2), (4) Date: Dec. 21, 2012

(87) PCT Pub. No.: WO2011/162727
PCT Pub. Date: Dec. 29, 2011

(65) Prior Publication Data
US 2013/0102084 A1    Apr. 25, 2013

Related U.S. Application Data

(60) Provisional application No. 61/398,468, filed on Jun. 25, 2010.

(51) Int. Cl.
*C01B 31/04* (2006.01)
*H01L 51/00* (2006.01)
(Continued)

(52) U.S. Cl.
CPC ........... *C01B 31/0469* (2013.01); *B01J 21/185* (2013.01); *B82Y 30/00* (2013.01);
(Continued)

(58) Field of Classification Search
CPC .............. B01J 21/185; Y10T 436/143333; B82Y 40/00; C01B 31/0469; C01B 31/0476; H01L 31/0324; H01L 31/035209; H01L 31/035218; H01L 31/072
USPC ............................. 423/448; 438/22; 436/145
See application file for complete search history.

(56) References Cited

U.S. PATENT DOCUMENTS 7,071,258 B1    7/2006  Jang et al.
7,754,184 B2    7/2010  Mercuri et al.
(Continued)

FOREIGN PATENT DOCUMENTS

WO      WO 00/64808       11/2000
WO      WO 2004/108997    12/2004
(Continued)

OTHER PUBLICATIONS

Liu, N et al., "One-step ionic-liquid-assisted electrochemical synthesis of ionic-liquid-functionalized graphene sheets directly from graphite," Adv. Funct. Mater., (2008), vol. 18, p. 1518-1525.
(Continued)

*Primary Examiner* — Rebecca M Fritchman
(74) *Attorney, Agent, or Firm* — Opticus IP Law PLLC

(57) ABSTRACT

Methods of forming graphene by graphite exfoliation, wherein the methods include: providing a graphite sample having atomic layers of carbon; introducing a salt and a solvent into the space between the atomic layers; expanding the space between the atomic layers using organic molecules and ions from the solvent and the salt; and separating the atomic layers using a driving force to form one or more sheets of graphene; the graphene produced by the methods can be used to form solar cells, to perform DNA analysis, and for other electrical, optical and biological applications.

23 Claims, 12 Drawing Sheets

(51) Int. Cl.

| | |
|---|---|
| *B01J 21/18* | (2006.01) |
| *B82Y 30/00* | (2011.01) |
| *B82Y 40/00* | (2011.01) |
| *H01L 31/032* | (2006.01) |
| *H01L 31/0352* | (2006.01) |
| *H01L 31/072* | (2012.01) |
| *H01L 51/42* | (2006.01) |
| *H01M 4/58* | (2010.01) |
| *H01M 4/62* | (2006.01) |
| *H01M 4/66* | (2006.01) |
| *H01M 4/92* | (2006.01) |

(52) U.S. Cl.
CPC ............ *B82Y 40/00* (2013.01); *C01B 31/0476* (2013.01); *H01L 31/0324* (2013.01); *H01L 31/035209* (2013.01); *H01L 31/035218* (2013.01); *H01L 31/072* (2013.01); *H01L 51/0002* (2013.01); *H01L 51/4213* (2013.01); *H01M 4/5825* (2013.01); *H01M 4/625* (2013.01); *H01M 4/663* (2013.01); *H01M 4/926* (2013.01); *Y02E 10/50* (2013.01); *Y10S 977/842* (2013.01); *Y10S 977/892* (2013.01); *Y10T 156/10* (2015.01); *Y10T 436/143333* (2015.01)

(56) References Cited

U.S. PATENT DOCUMENTS

| | | | |
|---|---|---|---|
| 8,287,699 B2 | 10/2012 | Zhamu et al. | |
| 2004/0033189 A1 | 2/2004 | Kaschak et al. | |
| 2007/0155030 A1* | 7/2007 | Yang et al. | 438/22 |
| 2008/0206124 A1 | 8/2008 | Jang et al. | |
| 2009/0169467 A1* | 7/2009 | Zhamu et al. | 423/448 |
| 2009/0246528 A1* | 10/2009 | Istvan | 428/403 |
| 2009/0325071 A1 | 12/2009 | Verbrugge et al. | |
| 2010/0206363 A1 | 8/2010 | Choi | |
| 2013/0035500 A1 | 2/2013 | Sadana | |
| 2013/0087446 A1 | 4/2013 | Zhamu et al. | |

FOREIGN PATENT DOCUMENTS

| | | |
|---|---|---|
| WO | WO 2012/120264 | 9/2012 |
| WO | WO 2012/120291 | 9/2012 |

OTHER PUBLICATIONS

Vadukumpully, S., et al., "Cationic surfactant mediated exfoliation of graphite into graphene flakes," Carbon (2009) vol. 47, pp. 3288-3294.
International Search Report and Written Opinion for PCT/SG2011/000225.
Lu et al., "Tailoring graphite with the goal of achieving single sheets," Nanotechnology, vol. 10, pp. 269-272 (1999).
Li et al., "Chemically derived, ultrasmooth graphene nanoribbon semiconductors," Science, vol. 319, pp. 1229-1232 (2008).
Hernandez et al., "high-yield production of graphene by liquid-phase exfoliation of graphite," Nat. Nanotechnol. 2008, vol. 3, pp. 563-568.
Valles et al., "Solutions of negatively charged graphene sheets and ribbons," J. Am. Chem. Soc. 2008, 130, 15802-15804.
Park et al., "Chemical methods for the production of graphenes," Nanotechnol. Apr. 2009, vol. 4, pp. 217-224.
Cano-Marquez et al., "Ex-MWNTs: Graphene sheets and ribbons produced by lithium intercalation and exfoliation of carbon nanotubes," Nano Lett. 2009, vol. 9, No. 4, pp. 1527-1533.
Allen et al., "Honeycomb carbon: a review of graphene," Chem. Rev. 2010, vol. 110, No. 1, pp. 132-145.
Behabtu et al., "Spontaneous high-concentration dispersions and liquid crystals of graphene," Nat. Nanotechnol. Jun. 2010, vol. 5, pp. 406-411.
Novoselov et al., "Electric field effect in atomically thin carbon films," Science Oct. 22, 2004, vol. 306, pp. 666-669.
Geim, "Graphene: Status and prospect," Science Jun. 19, 2009, vol. 324, pp. 1530-1534.
Hummers et al., "Preparation of graphitic oxide," J. Am. Chem. Soc., Mar. 20, 1958, vol. 80, p. 1339.
Suslick et al., "Applications of ultrasound to materials chemistry," Annu. Rev. Mater. Sci. 1999, vol. 29, pp. 295-326.
Rao et al., "Crystal and molecular structures of alkali- and alkali-earth-metal complexes of N,N-dimethylformamide," Inorg. Chem. 1984, vol. 23, pp. 2080-2085.

* cited by examiner

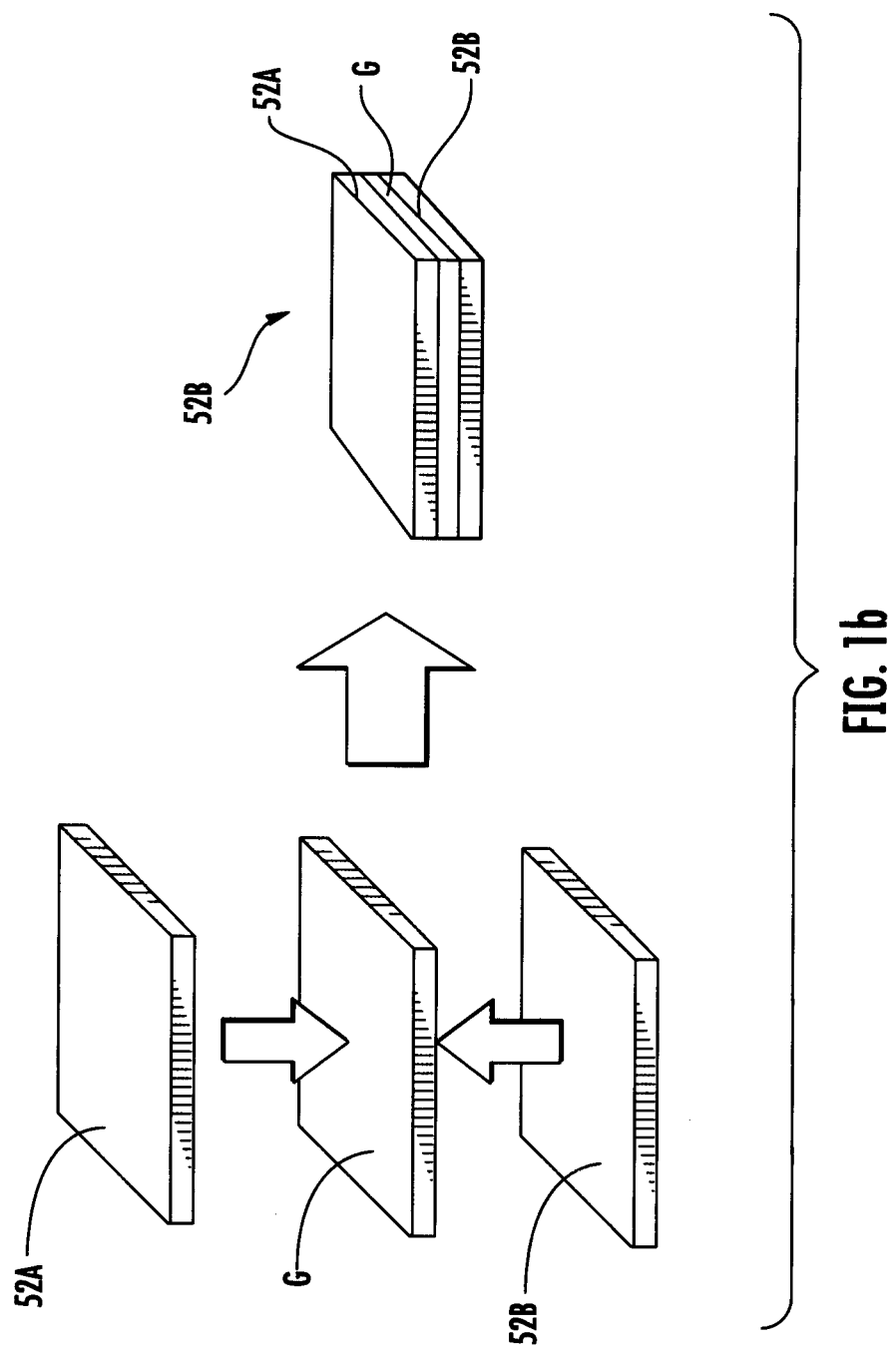

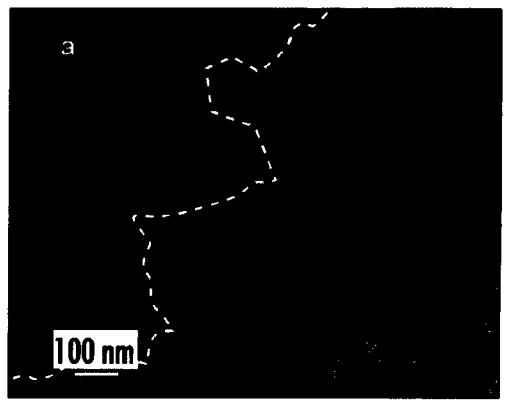
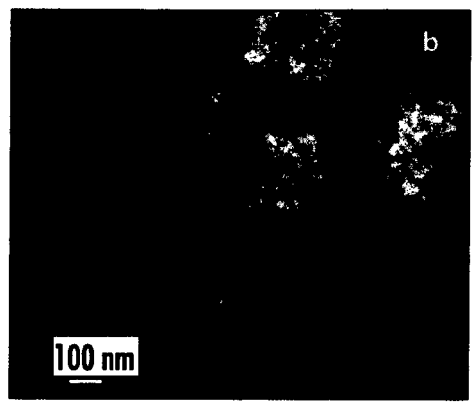
FIG. 3a  FIG. 3b
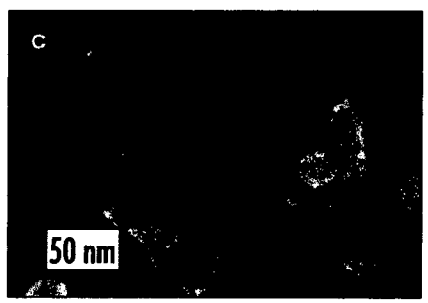
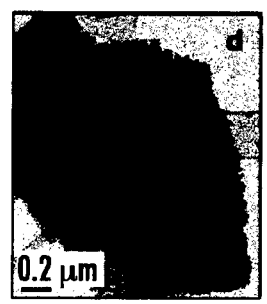
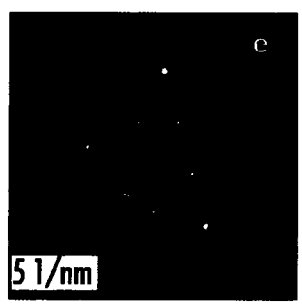
FIG. 3c  FIG. 3d  FIG. 3e
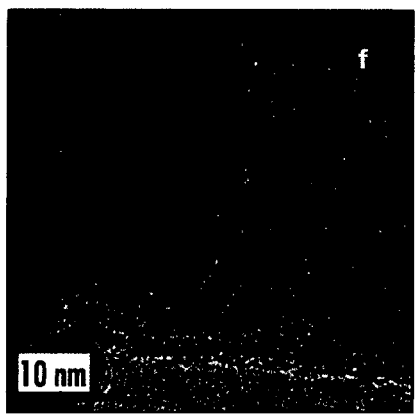
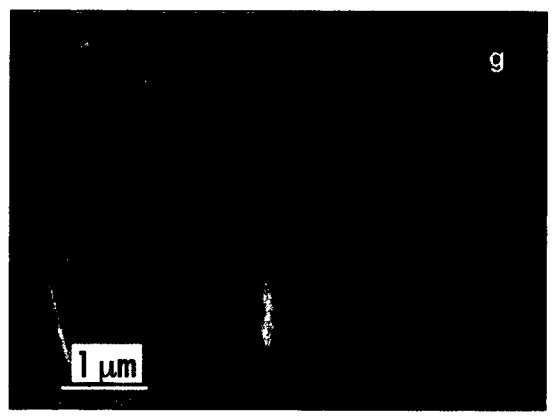
FIG. 3f  FIG. 3g

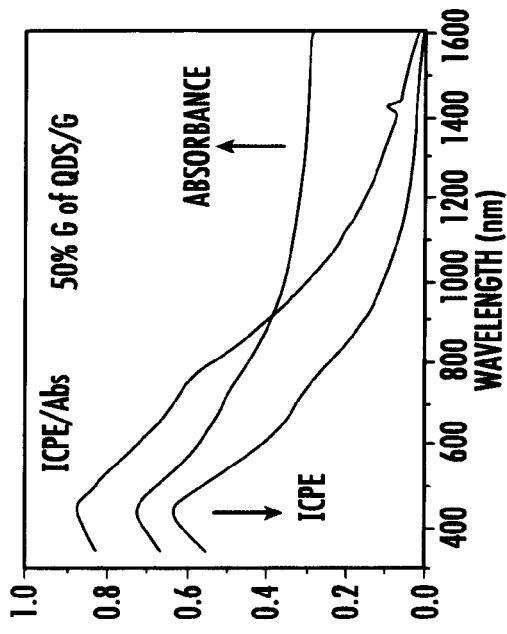
FIG. 4a
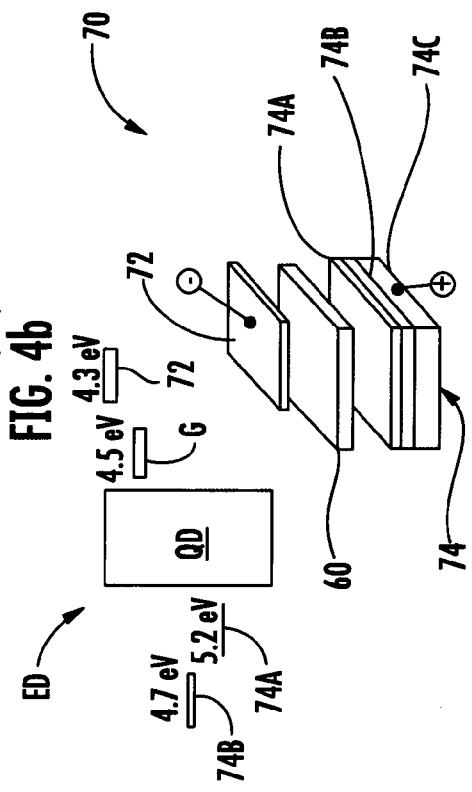
FIG. 4b
FIG. 4d
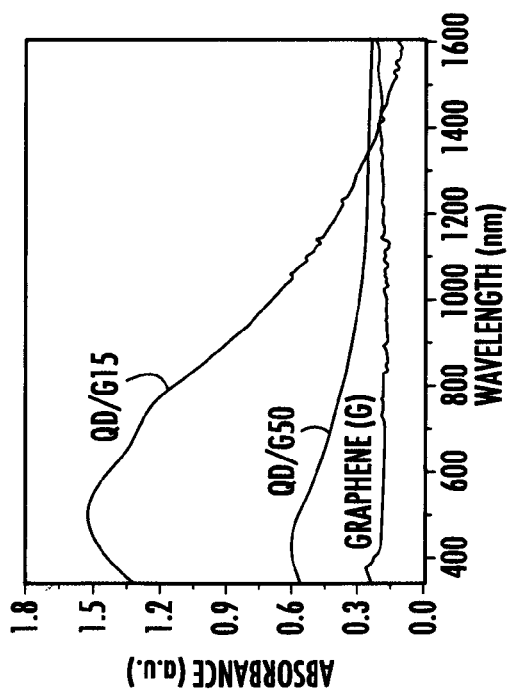
FIG. 4c
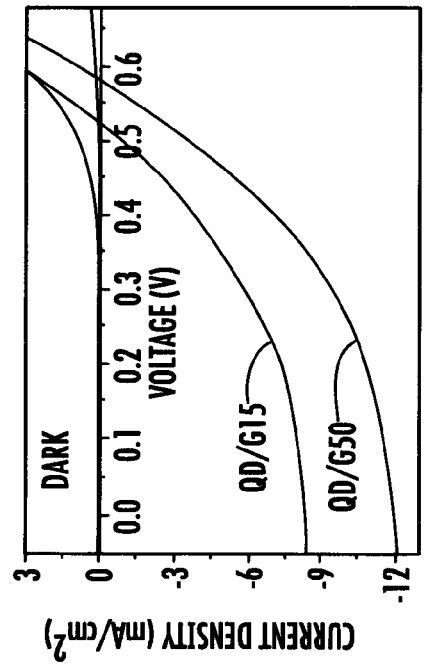

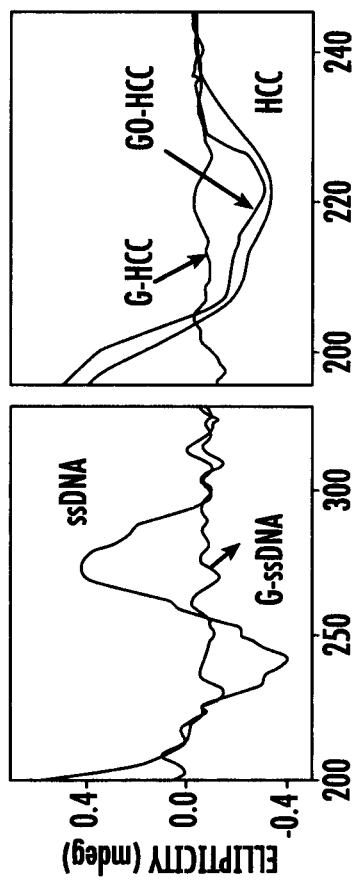
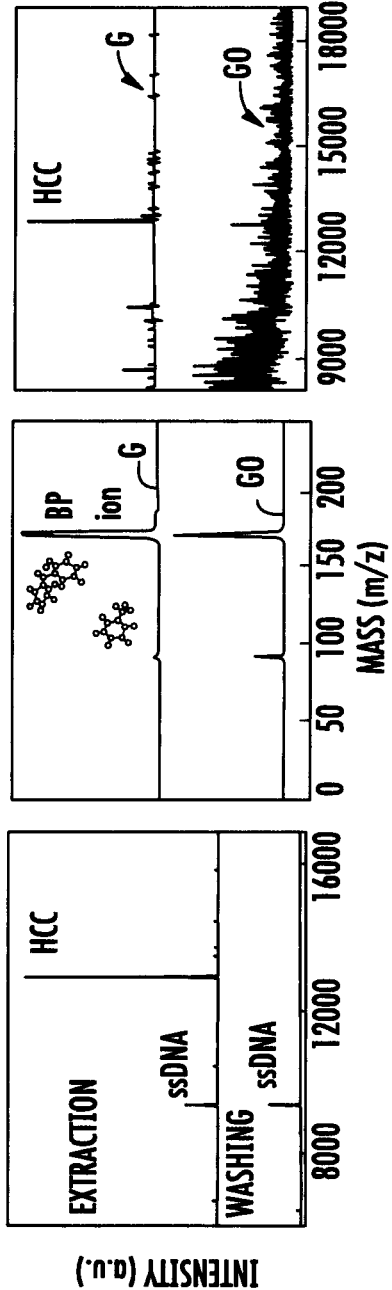
FIG. 6a  FIG. 6b  FIG. 6c  FIG. 6d  FIG. 6e  FIG. 6f

METHODS OF FORMING GRAPHENE BY GRAPHITE EXFOLIATION

CLAIM OF PRIORITY

This Application claims priority from U.S. Provisional Patent Application Ser. No. 61/398,468, filed on Jun. 25, 2010, and from PCT Patent Application No. PCT/SG2011/000225, filed on Jun. 24, 2011, which Applications are incorporated by reference herein.

FIELD

The present disclosure relates to methods of forming graphene, and in particular relates to methods of forming graphene by exfoliation of graphite.

BACKGROUND ART

Graphene (G) is a two dimensional sheet of atomic carbon with very attractive physical, optical and mechanical properties, including high charge carrier mobility, record thermal conductivity and stiffness. Currently, upwardly scalable graphene synthesis methods mainly include a solution-based graphite oxide-mediated route and chemical vapor deposition (CVD).

Graphite oxide-derived methods of forming graphene produce graphene samples with poor crystalline quality and high defect density. Films prepared by such methods required a high-temperature annealing process to convert the graphene from an insulator to a conductor. The CVD method is suitable for preparing large-area thin films, but is not amenable to solution-based processing. Solution-based processing is needed for bulk processing of graphene composites, blends, inks, etc.

Conventional methods for the solution-based synthesis of graphene from direct exfoliation/intercalation have yields that are generally less than 10%. This means 90% of the starting material, which is graphite, remained unexfoliated, and only 10% or less of the starting material is recovered as graphene flakes, each comprising one or a few layers of graphene. A problem with such low-yield methods is that they require multiple steps to generate sufficient products for further processing, and include tedious multiple steps of separating the unexfoliated materials from the exfoliated material.

Thus, there is a need for a high-yield method of forming graphene flakes directly from graphite that bypasses oxidation treatment, i.e., without forming graphene-oxide (GO).

SUMMARY

This disclosure describes a high yield (e.g., ≥90%) method of directly exfoliating graphite into "few-layer" (i.e., one or more layers of) graphene (sp2 carbon) without going through an oxidation route (i.e., without forming sp3 carbon, such as graphene oxide). A distinguishing feature of the method described herein is that it does not use oxidizers like nitric acid ($HNO_3$) or sulfuric acid ($H_2SO_4$) as reagents.

The exfoliated graphene produced by the methods described herein can be dispersed in solutions and recovered readily from the insoluble parent compound, graphite. These exfoliated graphene flakes can be functionalized by various organic and inorganic components. The high-yield method allows for bulk synthesis of high-quality graphene in large quantities for industrial-scale processing of polymer blends, composites, capacitors, lithium storage, DNA extraction, biosensors, solar cells, conductive paper, as well as conductive, transparent sheets.

An aspect of the disclosure involves using the graphene created by the methods disclosed herein to fabricate a nanocrystal/graphene heterojunction solar cell, which can be made to have record power conversion efficiency (e.g., 3.2%). Graphene solutions suitable for spin casting, roll-to-roll, ink-jet printing or other solution-based techniques are also disclosed that facilitate fabrication of a wide variety of graphene-based devices. The solution-based device fabrication process is low cost, scalable and has low toxicity. Use of the graphene as formed herein in solar cells and high sensitivity bio-extraction and detection, as well as in forming conducting sheets that are opaque (e.g., from paper) or transparent (e.g., from plastic) are also described.

An aspect of the disclosure is a high-yield, oxidation-free method of exfoliating graphite into one or more layers of graphene, e.g., "few-layer graphene." The method can serve as a bulk processing route for high quality, conducting graphene that is scalable for industrial production. Compared to oxide-derived graphene, the graphene flakes produced by the present methods have fewer defects and are more conducting and more hydrophobic, making the graphene flakes more suitable for solar cells and other applications as compared to graphene flakes formed via an oxidation process.

The foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure and together with the description serve to explain the principles and operations of the disclosure. The claims as set forth below are incorporated into and constitute part of this specification.

BRIEF DESCRIPTION OF THE DRAWINGS

FIG. 1b is a schematic diagram of a general graphene-based heterojunction;

FIGS. 3a-3g are electron microscopy images of nanocrystals/graphene heterojunctions;

FIGS. 4a, 4b and 4c are plots illustrating the optical and optoelectronic performances of an example of quantum dots/graphene active layer in examples of thin film solar cell (i.e., photovoltaic or "PV") devices;

FIGS. 6a and 6b plot the circular dichroism (CD) spectra of free ssDNA and G-ssDNA (FIG. 6a) and native HCC, HCC adsorbed on graphene G and graphene oxide GO (FIG. 6b);

FIG. 6c schematically illustrates how graphene G is used as a G-ssDNA SELDI probe;

FIG. 6d plots a SELDI-TOF MS spectra acquired directly after extraction of 1:5 ssDNA & protein mixture (top) and after washing with DI water (bottom);

FIG. 6e plots the MS spectra of the BP parent ion and fragmented ion using graphene G (top) and graphene oxide GO (bottom) as a SELDI probe, with the laser fluence set at 40 mJ·cm$^{-2}$;

FIG. 6f plots the MS spectra of HCC using a SELDI probe based on graphene G (top) and graphene oxide GO (bottom);

Figure 1A:
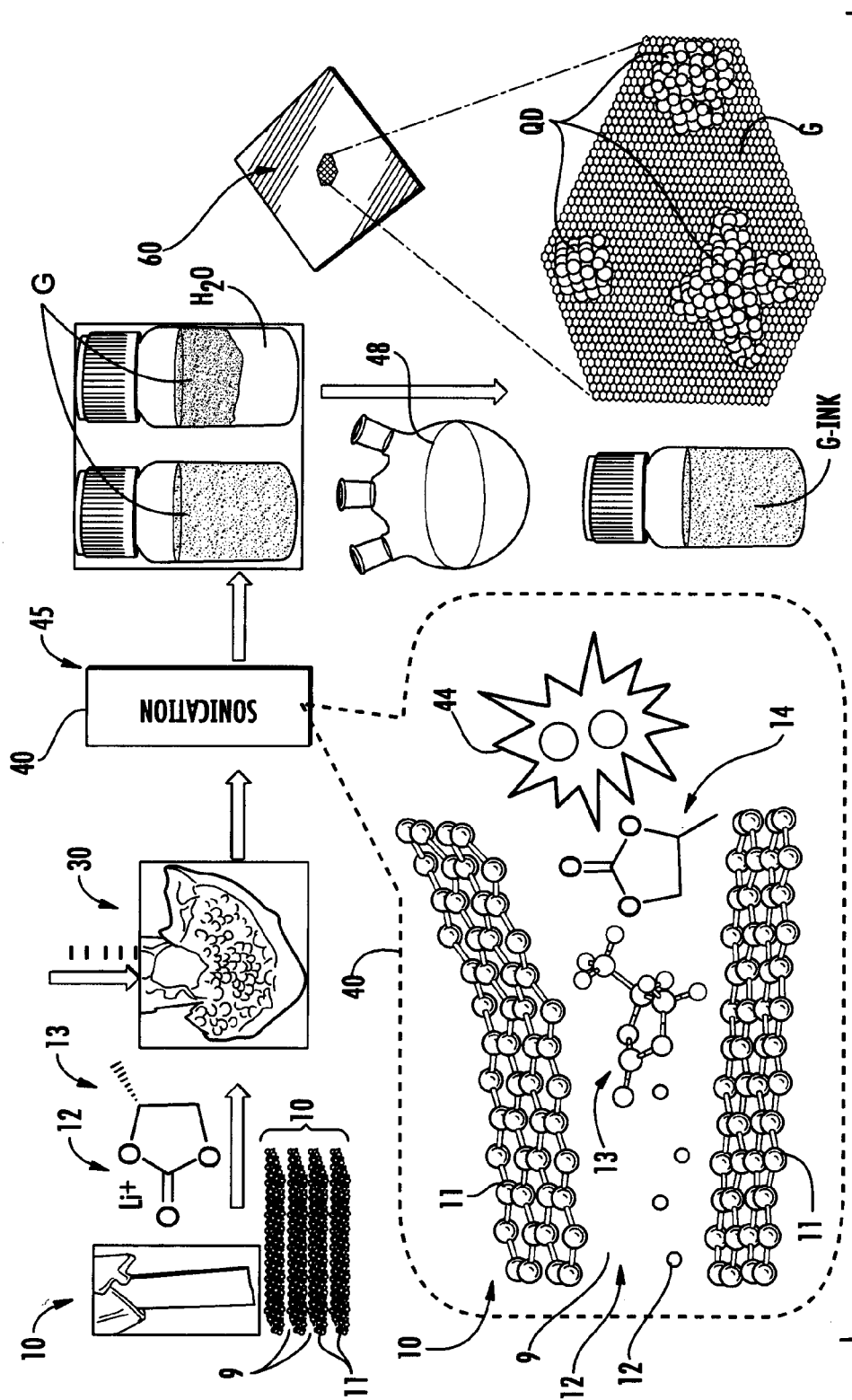
FIG. 1a is a schematic overview of the graphite exfoliation process to form few-layer graphene G, and also illustrates the fabrication of nanocrystal/graphene heterojunction that can be used as an active layer in solar cells.

The various elements depicted in the drawing are merely representational and are not necessarily drawn to scale. Certain sections thereof may be exaggerated, while others may be minimized. The drawings are intended to illustrate example embodiments of the disclosure that can be understood and appropriately carried out by those of ordinary skill in the art.

DETAILED DESCRIPTION

Aspects of the present disclosure are directed to methods of forming graphene G from graphite without forming graphene oxide. The method can be carried out in a manner that is highly efficient, e.g., ≥90%. Aspects of the disclosure also include multiple uses and applications of the graphene G produced using the methods described herein in areas such as biotechnology and solar cells. In the discussion below, graphene G is sometimes referred to G, graphene flakes referred to as FLG, and graphene oxide as GO where appropriate.

FIG. 1a is a schematic illustration of the method steps associated with forming few-layer graphene G by exfoliating graphite 10, and also shows the general fabrication steps associated with forming nanocrystal/graphene heterojunction solar cells.

In a first step of an example of the graphene-forming method, an initial (starting) graphite sample (material) 10 is provided. In a second step, the graphite sample is intercalated with a metal salt 12 in an electrolytic solution 13, e.g., is charged in a lithium salt/organic electrolyte solution for self expansion. In a third step, a discharging acid treatment step 30 is performed for a short time to remove any solid salts. An example acid treatment uses HCl.

In a fourth step, the atomic layers of the treated graphite 10 are exfoliated in a sonication step 40 involving sonication in a mixed solvent 14, e.g., in a chemical bath using ultrasound (e.g., VCX750, 20 kHz). As discussed below, the sonication step 40 represents just one example of a driving force 45 used in the exfoliation process. Other example driving forces 45 are described below.

The exfoliation process is repeatable. Incompletely exfoliated graphite 10 (thin graphite) can be returned as starting material to repeat the exfoliation process. This process can be controlled to to make few-layer graphene G.

Various layered crystalline graphite materials 10 can be used in the above-described method as the starting graphite. Such graphite materials 10 include for example natural graphite, synthetic graphite, highly oriented pyrolytic graphite (HOPG), graphite fiber, graphite rods, graphite minerals, graphite powder, and even chemically modified graphite.

The graphene G is generally dispersible in various organic solvents except for water. The solution dispersion is suitable for many solution-based techniques. It is suitable to make various nanocomposites in combination with various organic dyes, polymers, inorganic nanoparticles, metal catalysts and quantum dots. In an example fifth step 48, graphene G is subjected to a hot-injection process to form a solution dispersion that is generally referred to herein as graphene ink G-INK.

Exfoliation Process and Mechanism

The exfoliation mechanism is thought to be caused by the solvated ions 12 or/and molecular intercalation 44 of graphite interlayers 11. In particular, the diffusion of solvated cations (eg. propylene carbonate electrolyte or dimethylformamide solvated lithium ions) and anions (eg. propylene carbonate solvated ClO$_4^-$ or dimethylformamide solvated Cl$^-$ anions) into the space 9 between the carbon layers ("graphite interlayers") 11 weakens the π-π stacking of the graphene single layers, thereby initiating the exfoliation. The ionic radius of Li$^+$ (~0.09 nm) without solvation is much smaller than the interlayer distance of graphite (0.335 nm). Potential charging can be applied to promote solvated lithium ion or/and solvated anions into graphite interlayers 11 and the electrolyte intercalation 44 of graphite 10.

Thus, two key factors responsible for the exfoliation of graphite are believed to be: 1) the liquid electrolyte 13,14 (e.g., propylene carbonate or dimethylformamide) and salt (such as Li$^+$, ClO$_4^-$, or Cl$^-$) chemical system, and 2) the application of at least one driving force 45. Highly soluble lithium salt provides concentrated positive solvated Li ions or negative solvated ClO$_4^-$, or Cl$^-$ in an organic solvent, which favors its diffusion into the graphite interlayers. At least one of electrochemical, thermal, microwave, solvothermal and ultrasound can be used as the driving force 45 to enhance the exfoliation process, with ultrasound (sonication) being discussed in detail by way of a non-limiting example. The gas pressure caused by the decomposition of the intercalates into the graphite material 10 can assist the expansion and exfoliation of the graphite material.

Ultrasonic cavitation produces thermal shock injection and high vapour pressure in the microenvironment to exfoliate the graphite interlayers 11 and also cut the graphene sheet. Advantages of these methods include that the reactions can be performed with common laboratory solvents and with low toxicity, and that the purification process can be carried out using polar solvents and water. Since most of the solvents used for graphite expansion and exfoliation are water-soluble, water purification can remove most of the graphene impurities.

In a first embodiment of a first aspect of the disclosure, the exfoliation process involves a non-oxidative wet process to exfoliate graphite 10 or other layered materials. The non-oxidative process involves the electrochemical co-intercalation 44 of electrolyte-related ions and organic molecules into the graphite sample 10 to expand the graphite interlayers 11. Example organic molecules include carbonate electrolytes, such as propylene carbonate, ethylene carbonate, poly (propylene carbonate), and dimethylformamide). The expanded graphite 10 is finally exfoliated into graphene flakes G using the at least one driving force 45, e.g., the aforementioned sonochemical treatment 40.

In a second embodiment of the disclosure, the expansion of the graphite interlayers 11 is performed by different types of lithium ion salts 12 and nonaqueous liquid electrolytes. These may include by way of example: a) Lithium salts such as lithium perchlorate ($LiClO_4$), lithium hexafluorophosphate ($LiPF_6$), lithium tetrafluoroborate ($LiBF_4$), lithium chloride (LiCl), lithium iodide (LiI), lithium borates with aromatic ligands, lithium chelatophosphates; b) Nonaqueous liquid electrolytes such as linear dialkyl carbonates, ethylene carbonate (EC), propylene carbonate (PC), dimethyl carbonate (DMC), cis-butylene carbonates, dimethylformamide, tetrahydrofuran (THF), 2-methyltetrahydrofuran (2-Me-THF), dimethoxy propane, diethoxyethane (DEE), dimethoxyethane (DME) and poly(ethylene oxide) (PEO), polycarbonate, and polymethoxy ethers.

In a third embodiment of the disclosure, the exfoliation process of the intercalated (expanded) graphite 10 is achieved using any of the following driving forces 45: a sonochemical process, a thermal treatment, a microwave treatment, or combinations thereof.

General Aspects and Method

Aspects of the disclosure discussed in greater detail below include methods of applying graphene G to paper to form conductive paper, and applying graphene G to a transparent substrate such as a plastic film. FIG. 1a shows a graphene-based ink G-INK formed by the above-described fifth process 48.

Aspects of the disclosure include methods of coating or otherwise applying quantum dots QD to graphene G, as illustrated in FIG. 1a. This process is not limited to the types of quantum dots or inorganic nanoparticles. Example quantum dots QD are related to II-VI or VI-IV group chalcogenide semiconductor nanocrystals, (such as CdS, CdSe, CdTe, PbSe, PbS, $PbSe_xS_y$, PbTe, $Sb_2S_3$, $Cu_2S$, ZnS, SnTe, etc) and oxides (such as $TiO_2$, $MoO_3$, $SnO_2$, etc).

Another aspect of the invention is forming a graphene-based heterojunction 50 via the asymmetric application of suitable materials 52A and 52B on opposite sides of the graphene G, as illustrated in the general schematic diagram of FIG. 1b, and as explained in greater detail below. Example materials 52A and 52B include metals or metal/semiconductor nanocrystal catalysts. Examples also include different nano-metals on the different sides of a single sheet of graphene G. Other example materials 52A and 52B include different nano-metals and semiconductor nanocrystals on the different sides of single-sheet graphene G.

Aspects of the disclosure further include the use of graphene flakes FLG formed using the exfoliation methods described herein as a matrix for performing SELDI (Surface Enhanced Laser Desorption Ionization) for the analysis of biomolecules like DNA and RNA. The target analyte is not limited, and extends to a wide range of biomolecules such as proteins and nucleic acids.

Graphene Forms and Formulations

Graphene G obtained using the exfoliation methods described herein can be formulated as a powder. Such graphene powder can be readily dispersed in various polar solvents and hydrophobic solvents (chloroform and dichlorobenzene). In an example, a graphene-based ink solution dispersion (G-INK) and spin-casting is used to form a solar cell active layer 60, as illustrated in FIG. 1a.

Graphene G in the form of few-layer graphene sheets or single-layer flakes produced by embodiments of the exfoliation methods described herein can have a size distribution ranging from several hundreds of nanometers to 100 micrometers. The thickness of the graphene sheets can range from 0.4 nm to several nanometers. The yield of the method can be as high as 90% or greater. In certain cases, some thin graphite is produced (e.g., with a thickness of >20 nm), and this thin graphite is cycled through the exfoliation process to obtain single-layer or few-layer graphene G.

The graphene G produced using the methods described herein has number of desirable properties, such as high electrical conductivity and high hydrophobicity. Importantly, the graphene G is not been oxidized during the process.

Figure 2B:
FIGS. 2a-2b are SEM images and FIG. 2c is an atomic-force microscope (AFM) image of few-layer graphene G as exfoliated from graphite using the methods described herein.
Figure 2D:
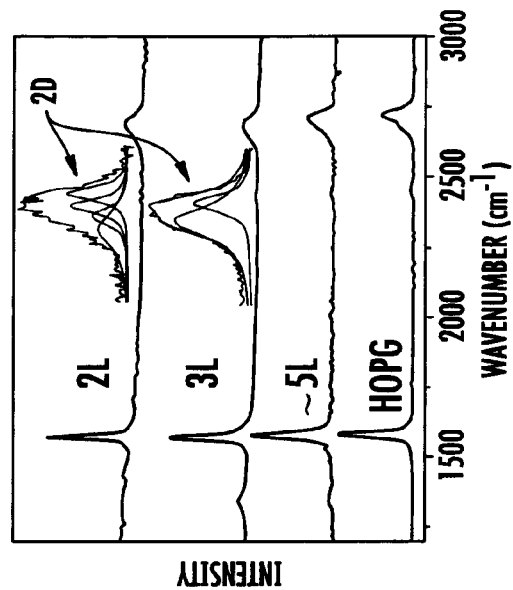
FIG. 2d are plots of the Raman spectra (514 nm laser) of a few layers of graphene G on Si substrates as compared to graphite.
Figure 2A:
Figure 2C:
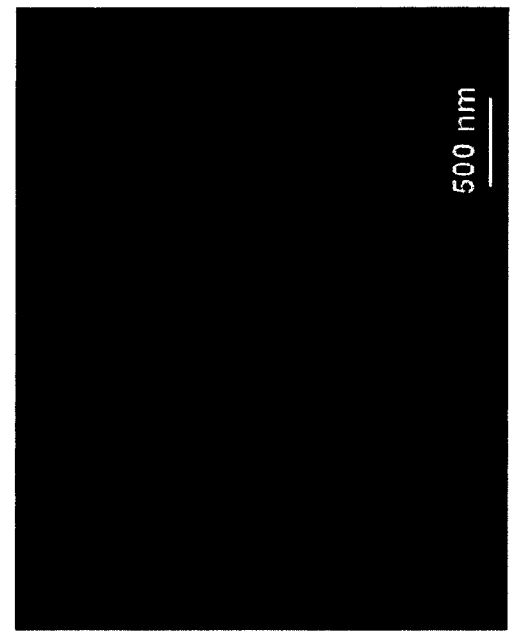

FIGS. 2a and 2b are scanning-electron microscope (SEM) images and FIG. 2c is an atomic-force microscope (AFM) image of graphene flakes (sheets) on a Si substrate, wherein the graphene thickness is ~1.5 nm, and is believed to be bilayer.

Raman spectroscopy was used to check the graphene species on Si substrates. FIG. 2d sets forth plots of the Raman spectra (514 nm laser) of a few layers of graphene on a Si substrate as compared to the spectra of graphite (HOPG). The inset plots are best fits of the 2D band of bilayer and trilayer in the wavenumber range from 2500 to 2800 $cm^{-1}$. The presence of a small D band (1341 $cm^{-1}$) can be assigned to edge effects. The number of graphene layers L is estimated from the positions, shapes and intensities of the 2D band peaks. The 2D band is centered at 2679-2686 $cm^{-1}$ with a shift from graphite (2670 $cm^{-1}$). FIG. 2d (inset) presents the best fit to the Lorentzian peaks, which is indicative of the thickness of the graphene G, i.e. two and three layers (2L, 3L), respectively. The intensity ratio of $I_D/I_G$ indicates the low defect density and high quality of the graphene.

FIGS. 3a-3g are electron microscope images of nanocrystal/graphene heterojunctions 50 as schematically illustrated in FIG. 1b. FIG. 3a is a STEM image of CdTe/graphene, where CdTe is tetrapod-like branched nanocrystal. FIG. 3b is a SEM image of branched PbSe nanocrystal/graphene. FIG. 3c is a STEM image of PbS nanocrystal/graphene. FIG. 3d is a TEM image of one folded sheet of nanocrystal PbSe/graphene. FIG. 3e is an electron diffraction pattern of foldled sheet of FIG. 3d. FIG. 3f is a High-resolution TEM image of PbSe/graphene. FIG. 3g is a typical SEM image of a nanocrystal/graphene film for solar cell devices.

The TEM images of FIG. 3b show that the graphene sheets consisted of less than a few layers of graphene. An XPS analysis of the graphene composites confirmed that there was only a small amount of carbon oxidation.

Graphene-Based Solar Cells (PV Devices)

The fabrication of large-scale, low cost and solution-processible solar cells (i.e., photovoltaic or PV devices) is on the technological roadmaps of most countries. Organic-based solar cells are prime candidates for low-cost PV devices because of the low cost of production. Conventional organic PV devices use fullerene derivatives (PCBM) as the electron acceptor and p-type conjugated polymer (P3HT) with a reported power conversion efficiency of 5-6%. However, organic PVs suffer from stability problems and low quantum efficiency (i.e., low conversion efficiency of light to energy). In lieu of organic materials, quantum dots can be used.

Colloidal semiconductor nanocrystals present a wealth of size-dependent quantum physical and chemical properties, including high photon capture, a tunable shape and surface electronic structure. The best PCE is 3-4%, much lower than conventional bulk film PV devices. Solexant's Nanocrystal Solar Cell, developed at Lawrence Berkeley National Lab (LBNL), is the first solar cell based on ultrathin films incorporating nanocrystals made of high-performance, inorganic materials (1.7% for CdSe nanorod-polymer; 2.9% CdSe/CdTe nanorod). Solexant combines high-efficiency materials with additional manufacturing innovations to achieve cost savings of up to 50% compared to other PV device technologies.

A disadvantage of nanoparticles is their poor charge transport properties. Recently, some nanocrystals were reported to exhibit multiple exiton generation, which can theoretically increase the efficiency of single PV devices from 31% to 46%. The methods disclosed herein include coating graphene G with quantum dots QD to take advantage of the excellent charge transport properties of graphene. Graphene also acts as a segregating medium that prevents the quantum dots QD from aggregating.

The highly conductive graphene G produced using the methods disclosed herein can act as an effective carrier sink for exciton dissociation and charge. collection. In an example, a conventional hot-injection synthesis method is applied to obtain a nanocrystal/graphene heterojunction in solution. The nanocrystal/graphene heterjunction can be seen in SEM images such as that of FIG. 3a, with the interface IF highlighted with a white dotted line and with the nanocrystal portion is denoted as NC. TEM imaging confirms high crystallization of nanocrystals and few-layer graphene G. The nanocrystal attachment with a stabilizer on graphene G can improve the solubility and dispersion of graphene to overcome strong π-π aggregation of graphene. Thus, it allows for spin-coating or dip-coating to obtain a uniform film like colloidal nanocrystals.

Aspects of the disclosure also include forming bulk heterojunction solar cells that use a graphene-quantum dot composite to replace P3HT/PCBM commonly used in organic solar cells. The few-layer graphene G formed using the exfoliation methods described herein can be used as an active solar cell material in combination with inorganic nanocrystals. The nanocrystal/graphene heterojunction shows enhanced photocurrent compared to control sample of nanocrystal only. An example PV device according to the disclosure has an active layer in the form of a graphene/nanocrystal junction and has no organic active layer, and has a high PCE of 3.2% at a standard AM 1.5 condition.

An example PV device 70 is shown in FIG. 4d. The example PV device 70 includes a solar cell active layer 60 with an electrode (anode) 72 on one side and an electrode (cathode) 74 on the opposite side. In an example, electrode 72 comprises aluminum and electrode 74 comprises glass. In example, glass electrode 74 comprises three layers: a PEDOT:PSS layer (Poly(3,4-ethylenedioxythiophene) poly (styrenesulfonate)) 74A, an ITO (indium tin oxide) layer 74B and a glass layer 74C. FIG. 4d includes an energy-level diagram ED that shows the relative energy levels associated with the different layers that make up PV device 70. In an example, quantum dots QD comprise chalcogenide semiconductor nanocrystals. Experiments showed that the external quantum efficiency reached 60% at around 440 nm. The power conversion efficiency reached 3% for 50% graphene weight of nanocrystal/graphene, and decreased to 1.8% for 20% graphene.

The structure of PV device 70 is simple. In an experiment, an active layer 60 of PbSe/G of roughly 100 nm thickness was spin coated on the electrode of an ITO substrate 74B with a PEDOT:PSS coating before to form PEDOT:PSS layer 74A. An aluminum electrode 72 was then deposited on the dried active layer 60.

FIGS. 4a-4c present the optical properties and the performance of example PV devices 70. FIG. 4a plots the absorbance (arbitrary units) of two solution dispersion samples formed from dichlorobenzene and QD/graphene junctions, with the two solutions having different ratios of quantum dots and graphene. The absorbance of a graphene G dispersion is also plotted for reference. The curves are denoted QD/G50 (50% graphene, weight percentage) and QD/G15 (15% graphene, weight percentage) and are the samples of graphene deposited by QD once and twice, respectively. FIG. 4b plots the comparison of ICPE %, absorbance and external power conversion efficiency of QD/G50 (η 3.0%). FIG. 4c presents current-voltage curves of PV devices 70 with active layers 60 of QD/G50 (η 3.0%) and QD/G15 (η 1.79%).

The enhancement of absorption of PbSe nanocrystal over the graphene, and higher ratio of PbSe/G (second time deposition) has higher absorption, which indicates the resulting hybrid of PbSe/graphene can keep the quantum confinement of nanocrystals for light harvesting. The external quantum efficiency reached 60% at around 440 nm. This may indicate that high-energy light is more efficient for the charge separation and transport.

The graphene ratio has an effect on device performance. The power conversion efficiency is up to 3% for 50 wt % graphene of PbSe/graphene. It decreased to 1.8% for 20% graphene sample PbSe/G20, although its absorption is stronger. There is less interfacial transfer in the lower-ratio graphene sample, which may decrease the charge transport and thus the voltage and current density. The open-circuit voltage of a PbSe/G heterojunction cell is 0.58±0.1V, which much higher than the reported PbSe nanocrystal PV cell voltage of 0.2-0.3V). The voltage increase can be used to solve the problem of the native low voltage of narrow-bandgap PbSe nanocrystal PV devices. The voltage is not determined by the bandgap of PbSe since the nanocrystal size of PbSe has little effect on the voltage.

Thus, in an example, a nanocrystal/graphene heterojunction 50 is used as an active layer 60 of PV device (solar cell) 70. The solar cell structure is simple and the active film 60 of nanocrystal/graphene of controlled thickness can be spin caste or dip coated on an ITO electrode 74B.

The nanocrystal/graphene heterojunction 60 can also be used to form a photo-detector, such as IR detector.

Graphene as an Ultra-High Efficiency Extraction and Detection Platform

The graphene formed using the exfoliation methods described herein can be used as an efficient (and in some embodiments, an ultra-high efficient) extraction and detection platform for DNA. Graphene acts as a high efficiency and highly selective extraction platform for DNA in a mixture of DNA and proteins. DNA-adsorbed graphene can be used directly for Surface Enhanced Laser Desorption Ionization-Time of Flight-Mass Spectrometry (SELDI-TOF-MS). Graphene-based SELDI ("graphene-SELDI") probes can play an active role in selective extraction, purification, amplification, desorption and ionization of the biomolecule. The rapid and effective enrichment of biomolecules is potentially useful for analysis in genetics and genomics.

Laser Desorption/Ionization-Mass Spectrometry (LDI-MS) has emerged as an important tool for rapid and sensitive analysis of biomolecules. One of the most popular LDI methods is the matrix-assisted laser desorption/ionization (MALDI), which is capable of generating intact macromolecular ions. However, matrix interference in the low-mass regions poses a serious problem for small-molecule analysis.

Furthermore, in proteomics and genetics research, it is often necessary to extract the target molecule from the complex mixture of biological samples and contaminants, such as salts and surfactants, prior to elucidation of the structure using MALDI-MS. The presence of these contaminants is likely to decrease the quality of the MS spectra. Various biochemical or immunological methods are applied for this reason, including chromatography (i.e. HPLC) and affinity purification. However, these methods are time-consuming and add a significant cost to the analyses.

Surface-Enhanced Laser Desorption/Ionization (SELDI) has emerged as one of the alternatives to MALDI because it eliminates the use of the acidic organic matrix. Since its inception, SELDI affinity technology has progressed to be a powerful analytical tool. In contrast to MALDI, in which the sample-bearing surface merely presents the analyte for MS analysis, a SELDI probe surface plays an active role in the purification, extraction, amplification, desorption and ionization of the sample of interest, thereby cutting the time and cost for TOF-MS analysis. This disclosure includes the use of graphene flakes for the high-efficiency extraction of DNA and for performing SELDI analysis.

Aspects of the disclosure also include the use of graphene flakes FLG formed using the exfoliation methods described herein in the high-efficiency, selective extraction of biomolecules like DNA. The selective extraction efficiency is not limited to DNA, and extends to other biomolecules as well as to inorganic metals ions. For example, graphene flakes FLG produced using the exfoliation methods described herein can be directly used for pre-concentrating DNA in unfractionated blood samples. After extracting the DNA, the graphene flakes FLG can be directly used for SELDI or MALDI analysis, achieving femto-molar range ultra-high sensitivity detection. The extraction and detection limit is unmatched by prior art materials and methods. This means that the methods described herein can generate graphene flakes that can be used in bioanalytics, combining high-efficiency extraction and ultrasensitive detection in the analytical protocol.

Figure 5A:
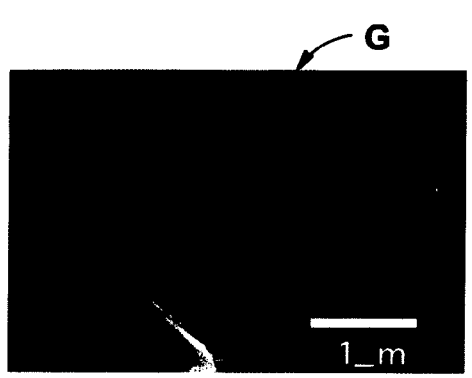
FIG. 5a is a SEM image of graphene G as formed using the methods described herein.
Figure 5B:
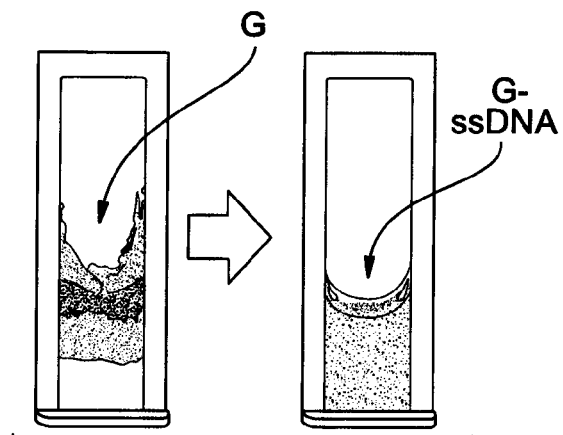
FIG. 5b shows two photographs, the left photograph being of pristine G sheets floating on water and the right photograph being of G-ssDNA after interaction with single-stranded DNA (ss-DNA)

In an example, graphene flakes FLG (FIG. 5a) were synthesized using the exfoliation methods described herein. The performance of the resultant graphene flakes FLG as a SELDI substrate was compared with GO flakes synthesized by the Hummer's method. Due to the presence of the oxidized functional groups, GO is soluble in water and forms a homogeneous dispersion. In contrast, hydrophobic G sheets are not dispersible in water and float (FIG. 5b, left side photograph). However, after interaction with single stranded DNA (ssDNA), the solubility of G improves remarkably (FIG. 5b, right-side photograph). This attests to the high loading capacity of G for DNA via π-π interactions. The effect of these non-covalent binding interactions results in quenching of the fluorescence from the dye-labeled ssDNA.

Figure 5C:
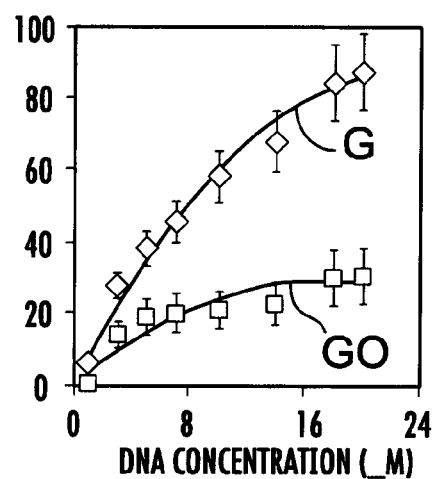
FIGS. 5c and 5d are plots of adsorbed material (mg/g) vs. concentration of material (μM) for ssDNA (FIG. 5c) and protein HCC (FIG. 5d) for both graphene G and graphene oxide GO.
Figure 5D:
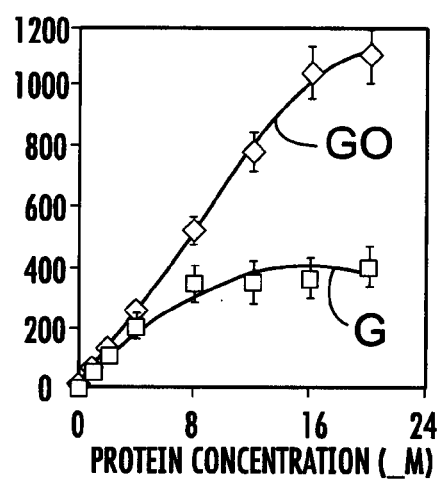

The adsorption isotherms of single-stranded DNA and HCC protein on GO and G were recorded and compared and the results plotted FIG. 5c and FIG. 5d. In particular, FIGS. 5c and 5d plot the adsorbed material (mg/g) vs. concentration of material ($\mu$M) for ssDNA (FIG. 5c) and protein HCC (FIG. 5d) for both graphene G and graphene oxide GO.

The adsorption capacity is judged from the saturation point of the adsorption isotherm. Graphene G shows a higher adsorption capability for ssDNA compared to graphene oxide GO (FIG. 5c). At a concentration of 20 $\mu$M of ssDNA, the adsorption capacity corresponds to 87 mg DNA per gram of G and 30 mg of DNA per gram of GO. The amount of ssDNA adsorbed on G (G-ssDNA) is four times higher than a polylysine-coated nanodiamond platform (22 mg/g at neutral pH). The adsorption capability of functionalized nanodiamond particles relies on the electrostatic binding capacity of polylysine and is pH dependent. In contrast, the as-prepared G platform provides effective π-π cooperative interactions with ssDNA under physiological conditions.

Evidence of ssDNA binding can be seen from the circular dichroism (CD) spectra (FIG. 6a) of free ssDNA and DNA-bound G (G-ssDNA). In the CD spectrum of DNA-bound G, the bands that are characteristic of the G-quadruplex and B-DNA configurations of free-DNA vanish upon π-π binding interactions with G, due to unfolding of the intrinsic structures. The binding interactions of GO with ssDNA is aided mainly by H-bonding or electrostatic interactions. At pH=7, the zeta potential of GO is determined to be −20 mV, which arises from its weakly acidic COOH and OH groups. The electrostatic repulsion between anionic GO and negatively charged ssDNA decreases the adsorption capacity of GO for ssDNA as compared to G.

The ability of graphene G to act as a SELDI probe for DNA and proteins was investigated. The unique aspect of graphene G is that it can combine high-loading capacity with high selectivity in the case of DNA extraction, by virtue of the π-π cooperative interactions between it and DNA.

To examine the selective extraction of DNA by graphene G, in one example graphene G was applied as the extraction platform in a mixture of HCC protein and DNA (5:1 ratio). A simple extraction procedure involves the vortexing graphene flakes FLG in the mixture, followed by high speed centrifugation (14000 rpm, 5 minutes) to recover the biomolecule-loaded graphene G, which was drop-casted onto a metal plate and used directly for SELDI analysis (FIG. 6c) with a Bruker Daltonics Autoflex II ion extraction linear time-of-flight mass spectrometer. Positive and negative ion spectra were recorded with a nitrogen laser having a laser beam LB (see FIG. 6c) with a wavelength $\lambda$=337 nm to ionize the biomolecules, with an example energy of 20 $\mu$J/pulse.

FIG. 6d (top) show the SELDI mass spectrum of graphene G following extraction of DNA and protein in the mixture without washing. It can be seen that the peak due to HCC protein is significantly higher than that of ssDNA due to its 5× higher concentration. After rinsing with deionized water, the HCC protein peak disappears completely, although the signal of ssDNA remains unattenuated [FIG. 6d (bottom)]. Using G as the SELDI probe, the lowest concentration detected for the HCC protein was 1 pM. The detection limit for ssDNA is 100 fM (FIG. 6b), which is one to three orders lower than MALDI method using a polymeric or a nanodiamond platform.

The desorption-ionization processes of SELDI matrices involve complex optical and mechanical phenomena as well as thermodynamic and physicochemical processes of phase transition and ionization. Our studies show that graphene G has distinct advantages compared to graphene oxide GO in terms of optical absorption and suppression of fragmentation in SELDI. First, the absorbance of graphene G is much higher than graphene oxide GO at the excitation laser wavelength of 337 nm used in the SELDI (FIG. S5) study. In fact, graphene G shows universal absorbance that is independent of frequency over a wide range, meaning broad spectral excitation is possible.

Next, a significantly lower degree of fragmentation of the analyte molecule on graphene G as compared to graphene oxide GO was observed. The benzylpyridinium (BP) ion, which is a standard thermometer chemical used to probe the desorption properties of the matrix, was used to compare the desorption process of G and GO-based SELDI probe (FIG. 6e). The much lower fragmentation and higher survival yield of the BP ion for the G SELDI probe compared to that for graphene oxide GO can be attributed to the efficient electron-phonon coupling in graphene G and its extraordinarily high thermal conductivity (4840-5300 $Wm^{-1} K^{-1}$). This allows it to act as a thermal sink during the rapid thermalization of laser-excited electrons.

In graphene G, collective phonon modes that are IR-active can be efficiently coupled to a continuum of electron-hole excitations through electron-phonon interactions. In addition, the weaker binding interactions of graphene G with proteins favor a more efficient desorption/ionization process for HCC compared to graphene oxide GO. For example, although graphene oxide GO shows a greater binding affinity and loading capacity for HCC compared to graphene G, only a noisy spectrum is obtained in SELDI, as compared to a sharp signal for graphene G (FIG. 6f).

Thus, graphene G can be used as a high efficiency preconcentration and direct SELDI analysis platform in bioanalytics. In addition, the binding interactions of graphene G with biomolecules is governed by hydrophobic and π-π interactions, and these binding forces favor the desorption/soft ionization processes specific to SELDI. The electrostatic bonding interactions of graphene oxide GO with proteins render it more suitable as a MALDI probe. The low noise level/interference of a G-based SELDI probe can provide a new level of sensitivity for biomarker recovery in proteomics and genomics study.

Adsorption of ssDNA and HCC

In experiments, HCC and ssDNA concentrations ranging from $10^{-7}$ to $10^{-4}$ M were prepared in a phosphate buffer. Both graphene oxide GO and graphene G (1 mg/ml) in deionized water were sonicated for 1 and 3 hours respectively prior to usage. Since graphene G is not fully soluble in water, the 3 hours sonication ensures that a homogeneous dispersion. The protein (0.5 ml) and graphene oxide GO or graphene G (0.5 ml) were vortexed together in a shaker for 2 hours to ensure equilibration, after which the mixture was centrifuged (14000 rpm, 5 mins) and the supernatant was collected. The adsorption isotherm of HCC protein on graphene oxide GO and graphene G was obtained by measuring the protein solution before and after treatment using UV-VIS spectroscopy and by the calibration curve of the protein.

For the extraction of ssDNA, the samples were prepared in similar manner as HCC protein. The amount of protein adsorbed, $q_e$ (mg/g) was determined from the change in protein adsorption at 409 nm before and after the addition of graphene oxide GO and graphene G using a Shimadzu UV-2450 spectrometer. A similar procedure was applied to ssDNA, and the amount adsorbed was determined by measuring the absorbance at 260 nm before and after addition of graphene oxide GO and graphene G.

The following equation was used to determine $q_e$:

$$q_e = (c_o - c_e)V/W$$

where $c_o$ and $c_e$ are the initial and equilibrium HCC or ssDNA concentrations respectively. The parameter V is the volume of solution (L) and W is the weight of the added graphene oxide GO and graphene G (g). The data can be fitted to the Langmuir and Freundlich isotherm.

Extraction of ssDNA from Mixture

A protein and ssDNA mixture was prepared by mixing 250 nM of HCC with 50 nM ssDNA each. The ratio of protein to ssDNA was 5:1. The protein and ssDNA mixture (500 µL) was transferred to the micro-centrifuge tube. 50 µL of graphene suspension (1 mg/ml) was added to the tube after sonication. The mixture was vortexed for 5 minutes and washed several times with DI water by repeated centrifugation (14000 rpm, 5 minutes) and decanted. The purified samples were directly analyzed with SELDI-TOF MS.

SELDI-TOF MS a) Sample Preparation.

A HCC protein solution and a ssDNA solution were prepared with concentrations ranging from $10^{-6}$ M down to $10^{-15}$ M. The protein solution (500 µL) was vortexed with GO or G solution (0.5 mg per 500 µL) in a micro-centrifuge tube for 2 hours. The protein-adsorbed GO or G was separated by centrifugation at 14,000 rpm for 10 minutes. The supernatant was discarded. DI water was added to wash the protein (or ssDNA), which was not bound. The process was repeated several times. An aliquot (1 µL) of the mixture was deposited on a spot in the polished steel sample holder (MTP target plate, Bruker Daltonics GmbH) and air-dried at room temperature.

b) SELDI-TOF MS Analysis.

Mass spectra were obtained using Bruker Daltonics Autoflex II ion extraction linear time-of-flight mass spectrometer. A linear positive-ion mode was used for the protein and a linear negative-ion mode was used for ssDNA. The acceleration voltage was set at 10 kV. Positive and negative ion spectra were recorded with a nitrogen laser beam LB (λ=337 nm) to ionize the biomolecules with a typical energy of 20 µJ/pulse. The focal spot was set to 0.02 mm. All mass spectra were acquired by signal averaging of 100 laser shots. Maldi-TOF MS analysis was performed in similar manner, with an additional step of adding an organic matrix (Sinapinic Acid) to the sample on target plate.

Graphene Flake Characterization

The graphene flakes FLG produced by the exfoliation methods described herein were analyzed by powder X-ray diffraction and scanning electron microscopy (SEM). A strong (002) peak (d value of 0.335 nm) in the XRD spectrum was observed due to the π-π stacked graphene layers in the graphite. After successful exfoliation, the π-π stacking of graphite was disrupted and the (002) peak was weakened or disappeared. The SEM imaging confirms the thinning of the graphite layers 11 upon sonication. The size distribution of graphene sheets was in the range from several hundred nanometers to several micrometers, with an average size of ~1 µm.

The graphene flakes FLG can be recovered as powder and dispersed in various organic solvents with the assistance of sonication. AFM imaging showed that example graphene flakes had an average thickness of 1.5 nm, which corresponds to bilayer graphene.

Chemicals and Materials

The various chemicals and materials used herein to carry out the methods of the disclosure are readily obtained through commercial channels. Highly ordered pyrolytic graphite (HOPG SPI-3, 10×10×1 mm) was bought from SPI Supplies. Graphite powders (Grade 230U) were provided by Asbury Graphite Mills, Inc. The following chemicals were obtained from Sigma-Aldrich and used without further purification: Lithium Hexafluorophosphate (LiPF6, 98%), lithium tetrafluoroborate (UBF$_4$, 98%), lithium perchlorate (LiClO$_4$, 98%, powder), propylene carbonate (PC, anhydrous, 99.7%), lithium chloride (LiCl, 99%), tetramethylammonium hydroxide (TMA, aqueous, 25 wt %), ammonia (28%), pyridine (anhydrous, 99.8%), Dimethyl Formamide (DMF), concentrated chloride acid (36.5%). Lead (II) oxide (PbO, 99.99%, powder), Selenium (Se, −100 mesh, 99.99%), Oleic acid (90%), trioctylphosphine (TOP, 90%), diphenyl ether (Ph$_2$O, 99%), 1-octadecene (ODE, 90%), lead acetate (hydrated), etc.

Graphene Synthesis

In one example method, graphite 10 was used as the negative electrode in a lithium salt solution 12-13 with a graphite rod as the positive electrode. The charging cell was graphite (−)/LiPF$_6$ (or LiClO$_4$) in propylene carbonate/graphite (+). The charging process was cycled for one week at a voltage of 4-30 V. The expanded graphite was then sonicated (step 40, FIG. 1a) in lithium ion in DMF mixed solvent for several hours by high intensity ultrasound (70% amplitude, sonics VCX750).

The resulting graphene powder was washed in N,N-Dimethylformamide (DMF) DMF (1% HCl adding) water and ethanol, respectively. The charging and sonication process was repeated several times to improve the graphene yields. A yield of 92% of graphene G from the initial starting graphite 10 was collected, based on weight measurement.

In another example, graphite 10 was provided in the form of highly ordered pyrolytic graphite (HOPG) (50 mg) as the negative electrode and was electrochemically charged at a voltage of 15±5V in a 30-50 mg/ml solution of LiClO$_4$ in propylene carbonate (PC). Graphite powder 10 was put in a porous plastic tube or paper membrane cell with a metal electrode inserted as negative electrode. A carbon rod (or lithium flake) was used as the positive electrode. During the electrochemical charging, HCl/DMF solution was used to remove the solid byproducts.

Following the electrochemical charging, the expanded graphite was transferred into a glass cell, followed by the addition of 50 mg/ml of LiCl in DMF solution and propylene carbonate and tetramethylammonium hydroxide. The mixture was then sonicated for >10 hours (70% amplitude modulation, Sonics VCX750, 20 kHz) with an ultrasonic intensity of ~100 W/cm$^2$. The sonicated graphene powder was washed by HCl/DMF and several polar solvents of DMF, ammonia, water, isopropanol and THF, respectively. The grey-black graphene powder was collected by centrifugation or/and filtering during the washing. A domestic microwave oven (Panasonic, 1100 W) was used to aid with the expansion of the graphite flakes, i.e., provided a microwave driving force 45.

In another example, the polarity of two graphite electrodes can be alternatingly reversed. In an experiment, two graphite electrodes were immersed in lithium percolate in propylene carbonate solution. An insulating porous membrane (such as paper or plastic) was used to avoid the short circuit of the two electrode graphite contact. The DC charge potential can be 7V-20V. The graphite electrode can be alternately an anode and a cathode. For example, two graphite electrodes in 50 mg/ml of LiClO$_4$ in propylene carbonate solution are charged under 7.5V direct current for 12 hours. The potential is then reversed for another 12 hours. Afterwards, the potential is reversed once again to the initial polarity state. The polarity reversals can be periodic with time. This programmed potential (polarity) reversal can push both propylene carbonate solvated Li cations and propylene carbonate solvated ClO$_4^-$ anions intercalate into the graphite.

Afterwards, the expanded graphite after charging can be thermally heated in inert gas flow (N$_2$ or Ar) at 150° C.-300° C. for minutes. The thermal decomposition of propylene carbonate and LiClO$_4$ can further expand the graphite due to explosive gas pressure. This expanded graphite by both charging and thermal treatment can be washed by acid HCl and H$_2$O and ethanol. The charging process is repeatable. The expanded graphite can be used as a starting material for further charging to obtain complete expansion of graphite. Then it can follow the sonication process. For example, it can be sonicated for ~30 min in bath sonication. The sonication medium can be propylene carbonate and aqueous tetramethylammonium hydroxide mixture.

CdTe Nanocrystal/Graphene

In an example of forming CdTe nanocrystal/graphene, all synthesis was carried out in inert environment. Two stock solutions of Cd-oleate and TOP-Te were separately prepared in advance. CdO (150 mg) in oleic acid (1.5 ml) and Te (100 mg) in TOP (1.5 ml) was separately heated to get a clear solution at 120° C. under Ar flow. 15 ml ODE was added into the CdO-oleate solution in three neck flask. Graphene (3-5 mg) in diphenyl ether (15 ml) was sonicated (60% amplitude) for 5 min and then immediately added to the CdO-oleate-ODE clear solution. The hot dispersion was heated to 250° C., and then TOP-Te solution was rapidly injected. After 7-15 minutes, the reaction mixture was allowed to cool down and 5 ml of acetone added.

The CdTe/graphene was purified by precipitation with acetone, isopropanol and pyridine, respectively (each twice).

In an example, CdSe nanocrystal/graphene hybrids can be prepared; wherein Se replaces Te in the above-described process.

Asymmetric Deposition of Nanocrystals on Graphene Sheets in Solution.

In an example, graphene dispersion in 1-octadecene/glycerol (volume ~1/1) was added to a CdO-oleic acid clear solution under Ar flow. 1 M of TOP-Te solution was then rapidly injected into the hot dispersion at 280° C. The temperature was kept at ~260° C. for 10 min and then the solution was cooled down to 160° C.

A Pb precursor, Ti (n-OC$_4$H$_9$)$_4$ and S source precursor (stock solutions) in ethylene glycol solutions were added to the above dispersion, respectively. The temperature was kept at 140° C. for another 10 min. The nanocrystal/graphene product was purified by precipitation with CH$_2$Cl$_2$, acetone, isopropanol and pyridine, respectively. Finally the nanocrystal/graphene of CdTe/graphene/PbS—TiO$_2$ was dispersed in pyridine for solar cell device fabrication (Stock solution 1: Pb(Ac)$_2$.3H$_2$O dispersed in HOC$_2$H$_4$OH with 2-mercaptoethanol as stabilizer. Stock solution 2: Ti(OC$_4$H$_3$)$_4$ in ethylene glycol. Stock solution 3: NH$_2$CSCH$_3$ in ethylene glycol with a small amount of H$_2$O to assist solubility.)

Solar Cell Device Fabrication

Traditional photovoltaic (PV) technologies tend to be prohibitively expensive. Solution-based processes can reduce the cost of PV cell manufacture. An aspect of the disclosure is thus directed to a solar ink based on graphene/colloidal inorganic nanocrystals that replaces the unstable organic photoactive components. The solar cell performance is equivalent to that of organic-based system, while the process is printable and industrially scalable for roll-to-roll processing.

In experiments, solar cell device fabrication methods were performed in a glove box to form a PV device 70 similar to that shown in FIG. 4d. Nanocrystal/graphene G in dichlorobenzene was spin coated onto PETDOT:PSS-coated ITO/glass substrates 74 (see FIG. 4d). After evaporating the solvent at 120° C., Aluminum back contacts (72) were then evaporated on the nanocrystal/graphene film 60 in a glove box, and all processing and measurements were air free.

A standard solar simulator (150 W, Newport Stratford) with an AM.1.5G filter was used to characterize the photovoltaic device response, where the average intensity was calibrated using a power meter.

Alternative to Ulrasonication

In an example embodiment, through tuning the liquid medium (electrolytes, ions), charging parameters, temperature, etc., the graphite sample 10 can be exfoliated into graphene G without using sonication step 40 (see FIG. 1a). This method is advantageous to obtain large graphene sheets (>10 μm). Graphene layer numbers (e.g., 1-100 layers), the thickness (e.g., 0.5-30 nm), size and shape (e.g., nanoribbons) and pattern are generally controllable. Wafer-scale multilayer graphene or graphite on a substrate can be patterned using known patterning techniques. The graphite exfoliation method of using Li intercalation can be used to exfoliate the graphene in a predetermined or otherwise select position in the pattern to control the layer number of graphene to meet the needs of a particular electronics or semiconductor application.

Graphene G can be dispersed in various solvents, and can be printable and made roll-to-roll processable. Scalable graphene synthesis may include graphite expansion, exfoliation of expanded graphite, and purification of the resultant graphene. Graphene film fabrication approaches include spin casting, membrane filtering, self-assembly and transferring process onto various substrates. Spray techniques may also be used. Transparent and conductive electrodes for photovoltaic cell using graphene sheets are aspects of the disclosure.

Graphene can hybridize with various materials including metals, semiconductors, polymer, glasses, ceramics, and so on. Especially, a graphene heterojunction can be made by hot injection of colloidal quantum dots, sol-gel processes and other solution methods. Some physical methods such as chemical vapor deposition, nanocluster deposition, sputtering can be used as well.

Graphene-supporting metal catalysts (Pt/G, Ag/G, Au/G, Ni/G, . . . alloy metal/G) catalysts typically need support. In an example heterojunction of Pt/Graphene, one advantage is that it has no organic stabilizer (organic capping layers) on Pt nanoparticles and thus "naked Pt" has higher exposed surface and catalytic properties than the common catalysts. Another advantage is thermal stability. In an experiment, Pt nanoparticles were directly grown on a graphene substrate using crystal matching, which avoids aggregation at high temperature. Thus, catalytic performance is preserved even at relatively high temperatures (e.g., ≤600° C.).

LiFePO$_4$/Graphene Hybrids

LiFePO$_4$ is a promising positive electrode candidate for high-power, safe, low-cost and long-life batteries for powering electric cars. LiFePO$_4$/graphene hybrids may be obtained by a precipitation process of making homogeneous LiFePO$_4$ powders on graphene sheets. The nucleation/growth parameters of Li$_x$FePO$_4$ of targeted phase and size may be tuned through fine tuning of the precipitation conditions at controlled temperatures.

Advantages are a fast charging and disacharging rates with high capacitance for LiFePO$_4$/Graphene hybrids. In experiments, LiFePO$_4$ nanocrystals were grown on graphene sheets. LiFePO$_4$ is insulating but graphene is electrically conductive. In the hybrid configuration, the advantages of the graphene component (e.g., good conductivity) overcome the disadvantages of the other component (e.g., poor conductivity) to improve the electrode and battery performance. The storage of electrical energy at high charge and discharge rates with a high capacitance is an important technology in modern society, and can enable, for example, electric vehicles and supply back-up for wind and solar energy.

FePt/Graphene for Hard Disk Usage

In experiments, monodisperse FePt nanocrystals were deposited on graphene sheets by a solution process. It is necessary for FePt to be annealed to transfer the fcc phase to the fct phase to get the desired ferromagnetic properties. One challenge is the serious aggregation of FePt nanoparticles by the annealing process. The FePt/graphene heterojunction can overcome this aggregation problem, and can remain in monodispersion because crystal matching blocs the aggregation during annealing.

Polymer Filler

In an example embodiment, the graphene formed using the methods of the present disclosure can be used as polymer filler for fundamentally changing the thermal and mechanical properties of the polymer matrix. Nanocomposites with the promise of strong, durable, multifunctional materials with low graphene filler content can be made by conventional methods. The graphene filler can change the glass transition temperatures of polymer with the associated gains in thermal stability.

Quantum Dots/Graphene Interface

The interface between quantum dots (such as CdSe/ZnS core-shell nanocrystals, PbS IR quantum dots) and graphene sheets can be engineered for different applications such as LEDs and solar cells. In quantum dot/graphene hybrids, either the high fluorescence or complete quenching of the fluorescence can be selected and is controllable by fine tuning the organic stabilizer of quantum dots. The quantum dots with high fluorescence with an organic stabilizer can be tailored to hybridize with graphene G to get solution-dispersible quantum dot/graphene hybrids. The 1-3 layer graphene has minimized optical absorption but can overcome the electrical insulating problem of long carbon chain stabilizers to make an LED. The quantum dots can be replaced by various dyes by tailoring the interfacial linking of dyes and graphene.

Graphene Conductive Ink and Graphene Paper

Graphene can be highly dispersed in several solvents, such as dichlorobenzene (DCB), chloroform, iso-propanol and N,N-Dimethylformamide to create a graphene-based ink G-INK (see FIG. 1a). This graphene-based ink G-INK can be easily brushed onto a substrate, which may be thin and flexible.

Figure 7C:
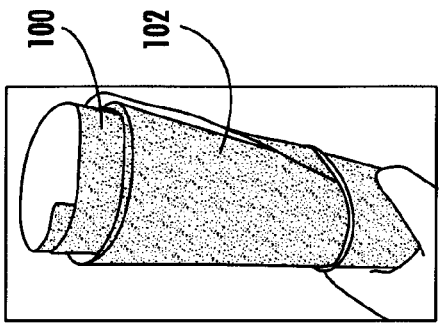
FIG. 7a through 7d illustrate various properties of flaked graphene (FLG) powder and its derived ink (G-INK) that can be used to make highly conductive paper.
Figure 7B:
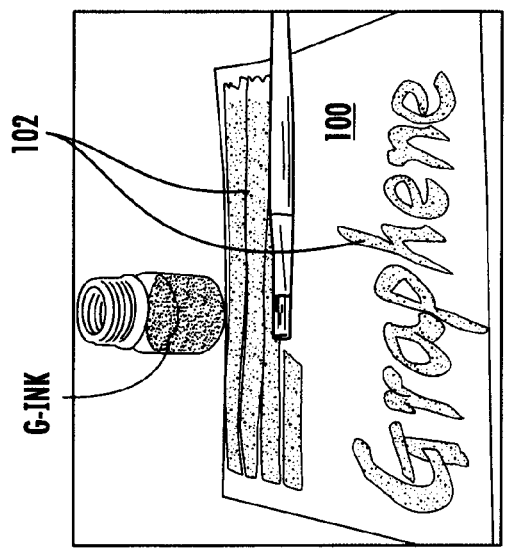
Figure 7A:
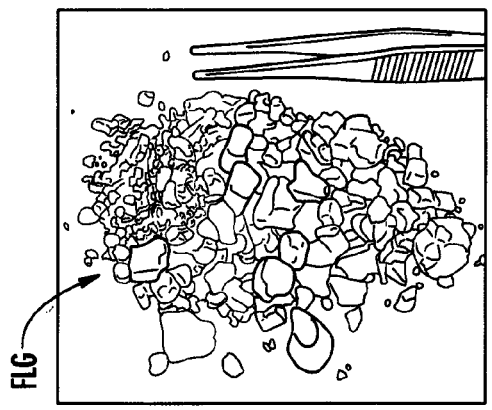

FIG. 7a through 7e illustrate various properties of FLG powder and its derived graphene-based ink G-INK that can be used to make a highly conductive substrate 100. FIG. 7a is photograph of graphene G in the form of FLG powder (15g). FIG. 7b shows G-INK that includes dichlorobenzene (10 mg/ml) for brushing and writing on common paper.

In an experiment, 800 mg of FLG powder was dispersed in 80 ml DCB followed by sonication for 10 min to get a good dispersion of 10 mg/ml of FLG in DCB to form graphene-based ink G-INK. The freshly sonicated FLG dispersion G-INK was brushed on commercial A4 printing paper as a substrate 100 to form a layer 102 of graphene flakes FLG. The A4 printing paper 100 was stacked on absorbent paper for the quick absorption of solvent. After the paper was dried in fume hood, a second layer 102 of FLG was applied with a brush. The brushing and drying process was repeated several times. Afterwards, the FLG layer 102 on the paper was pressed by a high pressure (such as a rod press) to tight the interfacial contact of the graphene flakes. The electrochemical charging method can be combined with sonication to scale up the production of dispersible graphene flakes FLG from graphite powder.

Figure 7E:
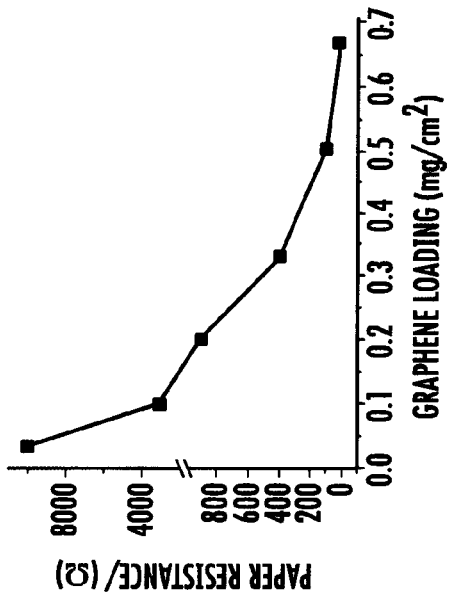
FIG. 7e plots the paper resistance in (ohms per square) vs. the amount of graphene loading (mg/cm2) for sheets of paper coated with different amounts of graphene ink.
Figure 7D:
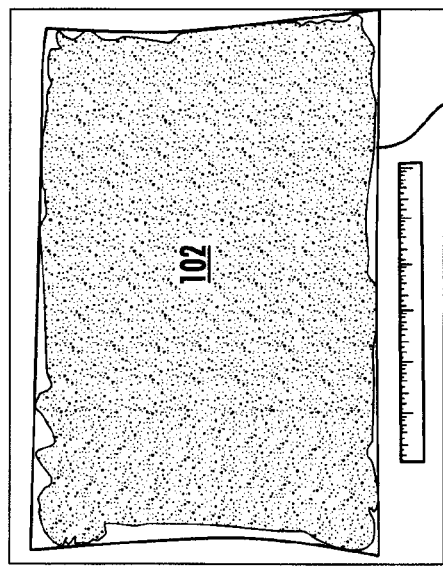

FIGS. 7c and 7d show the commercial A4 printing paper coated with FLG layer (film) 102. FIG. 7e plots the relationship between conductivity of the paper (Ohm per square) and the amount of graphene on the paper (mg/cm$^2$) in FLG layer 102. A sheet resistance as low as 15 ohm per square can be obtained when 0.7 mg/cm$^2$ graphene is loaded, which is better than reduced graphene oxide paper and comparable to high-quality carbon-nanotube-treated paper.

Conductive and Transparent Graphene Film on Plastic Substrate

Example aspects of the disclosure include forming a conductive and transparent substrate 150 using the graphene G as formed herein. Example plastic substrates 160 for forming a graphene-based transparent and conductive substrate (sheet) 150 include: polydimethylsiloxane (PDMS), polycarbonate, polyethylene terephthalate (PET), acrylic (polymethlamethacrylate), butyrate (cellulose acetate butyrate). In an example, the plastic substrates 160 are flexible.

In an example, graphene G in the form of a dried powder was put on a substrate 150 in the form of a clean transparent plastic film 160 and polished into a uniform graphene film. The polishing can be done by using another plastic substrate and a soft cloth and paper. The polishing process operates much like pushing around cards on a table surface until they are overlaid into a uniform dispersion. The polishing method does not require chemicals, and is simple and highly environmental friendly and scalable.

A good transparency (e.g., up to about 70%) and good conductivity (e.g., about 1.5 kohm/□) can be obtained by a manual polishing using about a 1 um size few-layer graphene powder. Even better performance can be obtained by using relatively large (>10 μm) graphene flakes FLG.

Figure 8A:
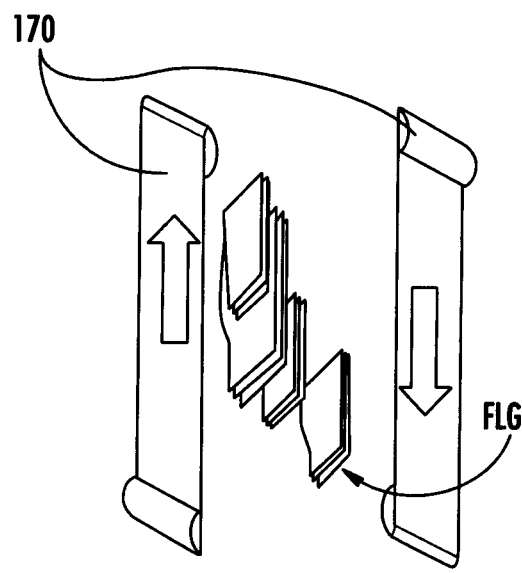
FIG. 8a and FIG. 8b illustrate the formation of an example transparent, conducting substrates (sheets) using highly continuous FLG films on plastic substrates by manual polishing dried FLG powder.
Figure 8B:
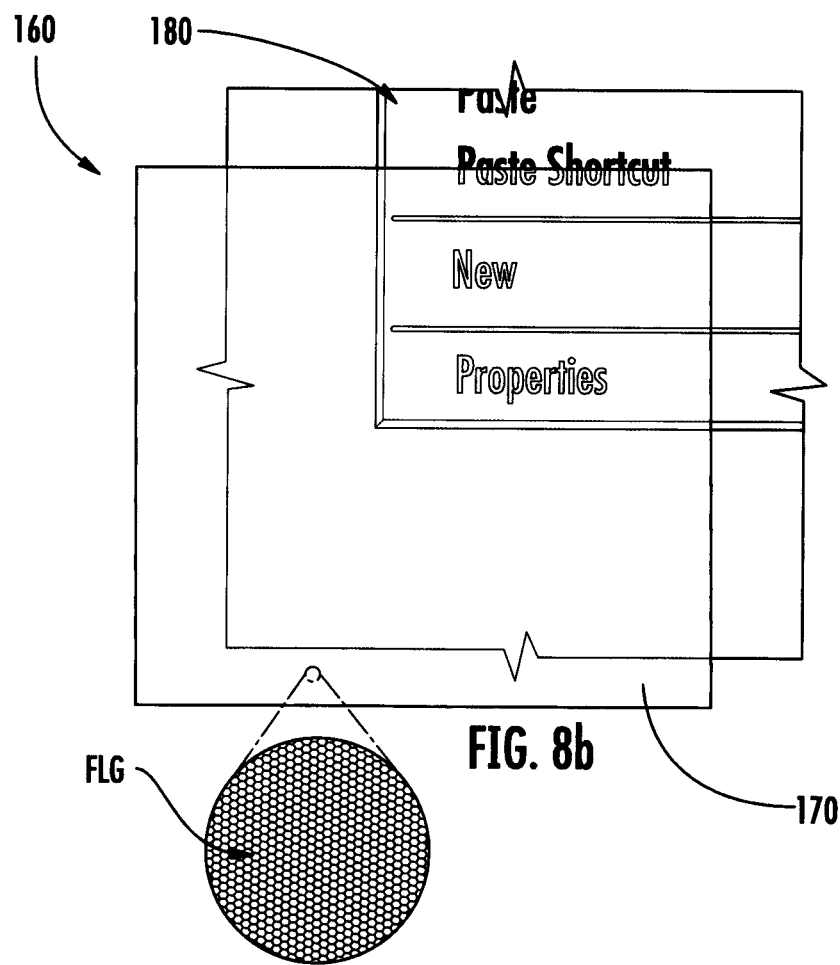
Figure 8D:
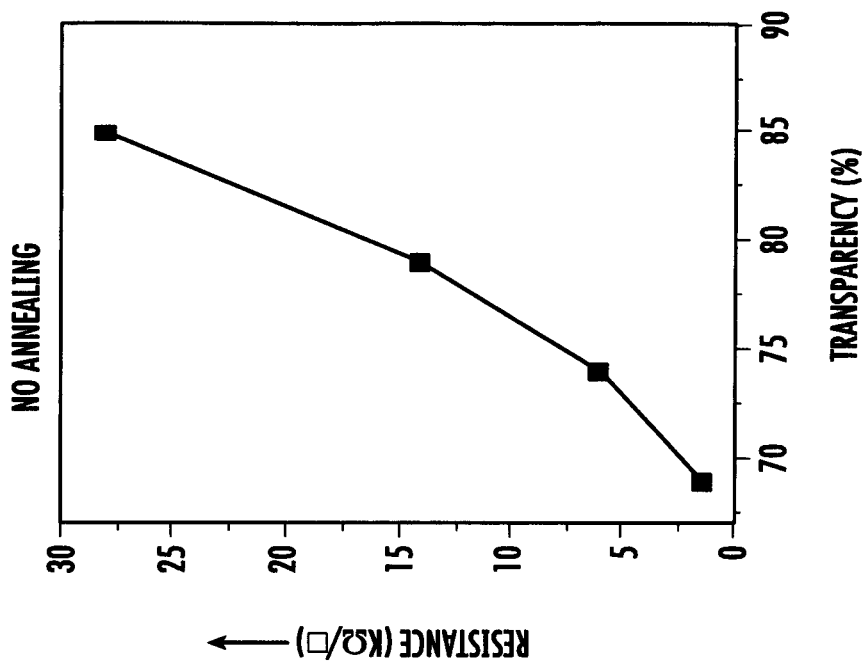
FIG. 8d plots the resistance (kohms per square) vs. transparency (%) for the four example transparent, conducting sheets, with no annealing.
Figure 8C:
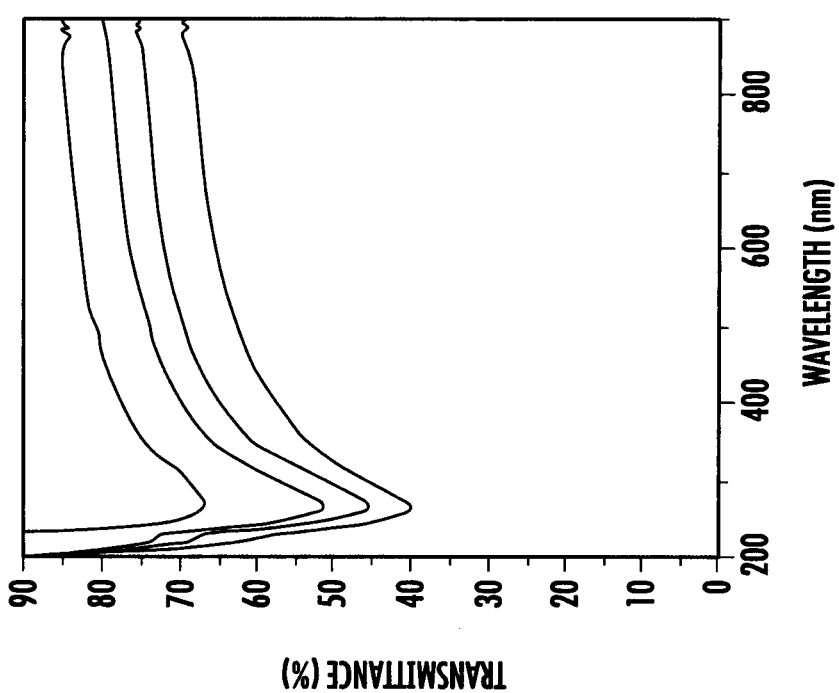
FIG. 8c plots the transmittance (%) vs. wavelength (nm) for four example transparent, conducting sheets.

FIG. 8a through FIG. 8d illustrate various properties of a conductive, transparent substrate 150 formed using a highly continuous FLG film on plastic substrates 160 by manual polishing of dried FLG powder. FIG. 8a schematically illustrates polishing FLG powder with two transparent plastic substrates 170. FIG. 8b depicts an example FLG film as formed on a plastic substrate 160 to form conductive, transparent substrate 170, and through which the background in the form of is computer screen 180 is readily visible. FIG. 8c plots the transparency spectra in transmittance (%) vs. wavelength (nm) for four example conductive, transparent substrates 150, which essentially measure the transparency of the FLG layer. FIG. 8d plots the electrical resistance (kohms per square) vs. transparency (%) for the same four example conductive, transparent substrates 150 of FIG. 8c.

Characterization of Asymmetric Nanocrystal/Graphene Heterojunction

As discussed above, aspect of the invention is employing graphene as produced herein to form a graphene-based heterojunction 50, such as shown in FIG. 1b. In an example, this is accomplished in combination with layers 52A and 52B that constitute asymmetric supporting metals or metal/semiconductor nanocrystal catalysts. Examples include different nanometals as layers 52A and 52B on each side of a single sheet of graphene G. Other examples include different nanometals and semiconductor nanocrystals on each side of graphene single sheet.

The special heterojunction 50 formed by graphene G in the form of few-layer graphene single sheets with different materials 52A and 52B on the two opposite sides are useful to open the bandgap of graphene due to strain-engineering. The small bandgap of graphene flakes with asymmetric materials is useful for charge transfer and electron-hole separation and transfer, especially hot carrier transport.

Figure 9A:
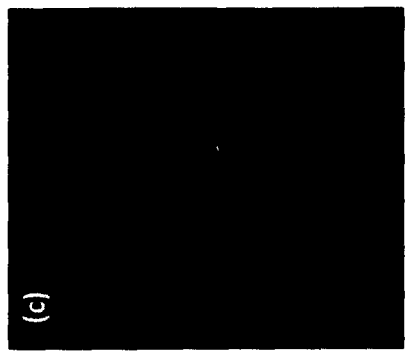
FIG. 9a through FIG. 9e are electron microscopy characterizations of asymmetric nanocrystal/graphene heterojunction of CdTe/graphene/PbS—TiO$_2$.
Figure 9B:
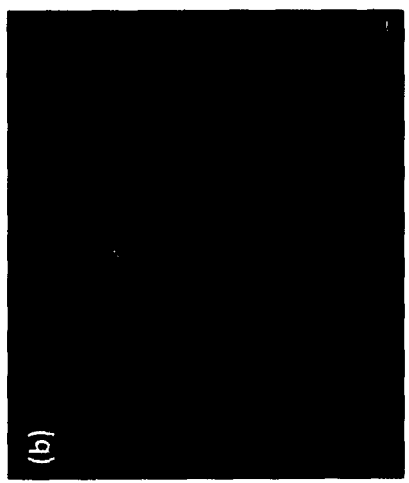
Figure 9C:
Figure 9D:
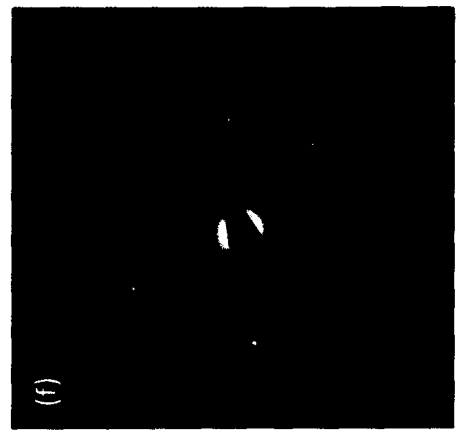
Figure 9E:
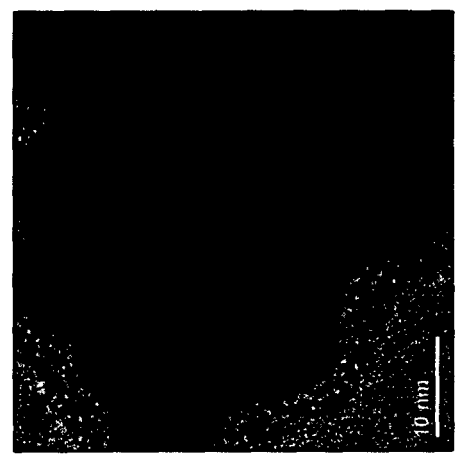
Figure 9F:
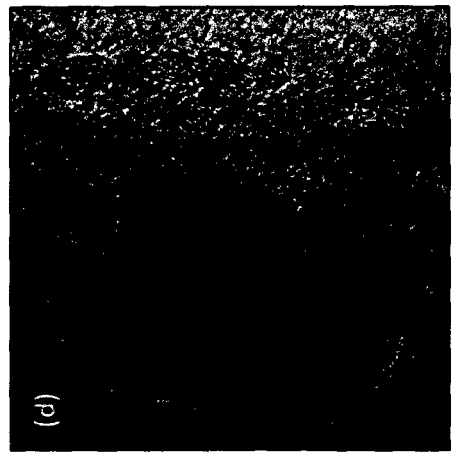
FIG. 9f and FIG. 9g are electron diffraction patterns of an example CdTe/graphene/PbS—TiO$_2$ sheet.
Figure 9G:
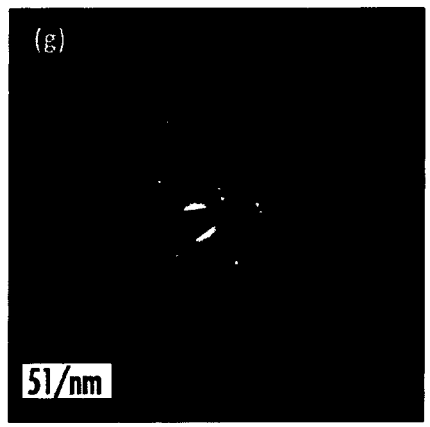
Figure 9H:
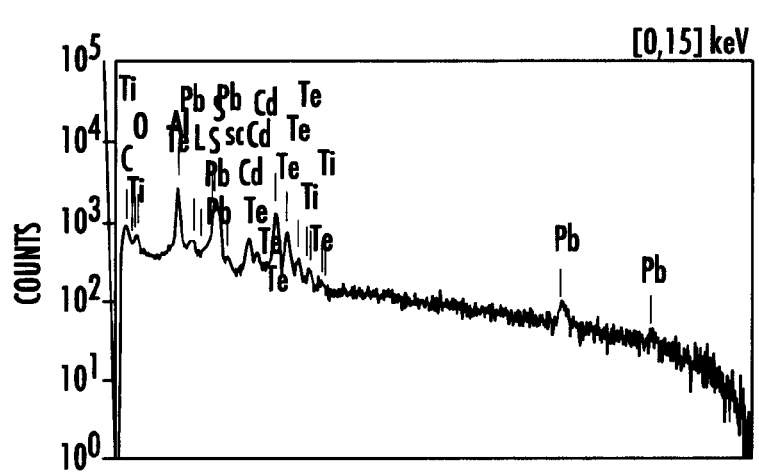
FIG. 9h plots the results of an EDX analysis of the CdTe/graphene/PbS—TiO$_2$ sheet.
Figure 9I:
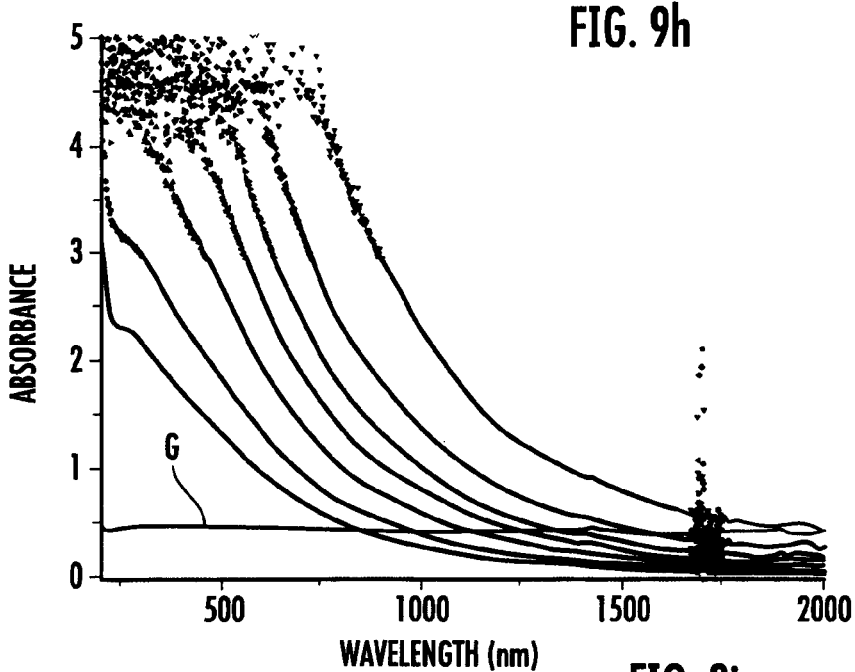
FIG. 9i plots the concentration-dependent optical absorption spectra (absorbance vs. wavelength) of the CdTe/graphene/PbS—TiO$_2$ sheet of FIG. 9h as dispersed in isopropanol, with the "graphene only" dispersion shown for the sake of comparison.

FIG. 9a through FIG. 9e are electron microscopy characterizations of an asymmetric nanocrystal/graphene heterojunction 50 made of CdTe/graphene/PbS—TiO$_2$. FIG. 9f and FIG. 9g are electron diffraction patterns of an example CdTe/graphene/PbS—TiO$_2$ sheet. FIG. 9h plots an EDX analysis of the CdTe/graphene/PbS—TiO$_2$ sheet. FIG. 9i plots the concentration-dependent optical absorption spectra (absorbance vs. wavelength) of the CdTe/graphene/PbS—TiO$_2$ sheet as dispersed in iso-propanol, with the "graphene only" dispersion indicated by "G" shown for comparison. The plot indicates a strong absorption at the larger wavelengths. Compared to graphene G, the optical absorption is enhanced in wide wavelength from UV to visible band to IR band of 200-2000 nm, which is suitable for light harvesting.

Other Example Applications

There are a number of other applications for which the graphene G as formed herein is suitable for use:
1) Fuel cell catalyst (Pt/G, Pt—Pd/G, etc.). Catalyst graphene supports technologies that can improve the catalytic activity of Pt-based catalysts, reduce the Pt usage in catalysts, thus lowering fuel-cell cost.
2) Automobile exhaust purifier. The advantages are high heat resistance with large surface area.
3) Raman spectroscopy inspection of metal/graphene hybrids (Au/G, Ag/G). This can be used for in situ inspection of pesticide residues on food/fruit. Raman signal amplification may be provided by gold or silver nanoparticles on graphene sheets with an ultrathin silica shell.
4) Graphene/oxide hybrids, such as TiO$_2$/G, SnO$_2$/G, ZnO/G, etc.: A sol-gel process can be used to make graphene/oxide heterojunctions with high performance and efficiency for a wide range of applications.
5) Asymmetric Pt/graphene/TiO$_2$ heterojunctions: Such heterojunctions include Pt nanoparticles deposited on one side of a single sheet of graphene G, while TiO$_2$ nanoparticles are deposited on the other side.
6) Asymmetric CdTe/graphene/PbS—TiO$_2$ heterojunction: includes CdTe nanoparticles deposited on one side of a single sheet of graphene G, while PbS nanocrystals and immersed TiO$_2$ nanoparticles are deposited on the other side.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto. The claims as set forth below are incorporated into and constitute part of this Detailed Description.

What is claimed is:
1. A method of forming graphene, comprising:
providing a graphite sample having atomic layers of carbon with spaces in between;
immersing the graphite sample in an electrolytic solution of propylene carbonate and lithium perchlorate;
performing electrolysis on the immersed graphite sample to introduce organic complexes of lithium ions and propylene carbonate into the spaces between the atomic layers to form intercalated graphite;
subjecting the intercalated graphite to a thermal treatment that expands the space between the atomic layers to form expanded graphite; and separating the atomic layers using sonication to form one or more sheets of graphene.

2. The method of claim 1, including forming the graphene as one or more flakes of graphene or one or more sheets of graphene derivatives.

3. The method of claim 1, wherein the graphite sample is selected from the group of graphite samples comprising: natural graphite, graphite minerals, synthetic graphite, highly oriented pyrolytic graphite (HOPG), graphite fiber, graphite rods, and graphite powder.

4. The method of claim 1, further comprising:
combining the graphene with quantum dots to form a heterojunction configured to function as an active component in a photovoltaic device.

5. The method of claim 4, wherein said combining includes performing at least one of:
a sol-gel process, a hot-injection process, a chemical vapor deposition process, a nanocluster deposition process, and a sputtering process.

6. The method of claim 4, wherein said combining includes asymmetric deposition of different nanocrystals on difference sides of the one or more graphene sheets.

7. The method of claim 6, further comprising:
providing a hydrophobic/hydrophilic solution environment with the graphene as a surfactant interface;
providing hydrophobic and hydrophilic precursors so as to form at least one of nanocrystals, particles and polymer; and
depositing at least one of the nanocrystals, particles and polymer on the surfactant interface.

8. The method of claim 4, including providing the quantum dots as chalcogenide semiconductor nanocrystals.

9. The method of claim 1, further comprising dispersing the one or more graphene sheets in an organic solvent.

10. The method of claim 1, further comprising forming providing on opposite sides of the one or more sheets of graphene different nano-metals or semiconductor nanocrystals to form a graphene-based asymmetric heterojunction.

11. The method of claim 10, further comprising forming the graphene-based asymmetric heterojunction as CdTe/graphene/PbS-TiO$_2$ or CdSe/graphene/PbS-TiO$_2$.

12. The method of claim 1, further comprising:
applying the graphene to a flexible, non-conducting substrate to form a flexible, conducting substrate.

13. A method of forming graphene from a graphite sample comprising a lattice of carbon atoms that define atomic layers and a layer spacing, comprising:
intercalating propylene carbonate and lithium perchlorate into the carbon atom lattice via direct-current electrolysis of a 30 to 50 mg/ml solution of the lithium perchlorate in the propylene carbonate at a voltage of 15V+/−5V to form intercalated graphite;
expanding the layer spacing by subjecting the intercalated graphite to a thermal process to form expanded graphite; and
mechanically exfoliating one or more carbon atomic layers from the expanded graphite to form the graphene.

14. The method of claim 13, including forming the graphene as one or more flakes of graphene or one or more sheets of graphene derivatives.

15. The method of claim 13, further comprising:
employing the graphene in a bioanalytical technique involving biomolecules to selectively extract or pre-concentrate the biomolecules.

16. The method of claim 15, further comprising:
using the selectively extracted or pre-concentrated biomolecules as a substrate for SELDI for directly analyzing the biomolecules without mixing with an organic matrix.

17. The method of claim 13, where the biomolecules include at least one of: one or more proteins, DNA and RNA.

18. The method of claim 13, further comprising combining the graphene with chalcogenide semiconductor nanocrystals to form a heterojunction.

19. The method of claim 13, further comprising forming a photovoltaic device from the graphene by:
using the graphene, forming a solar cell active layer comprising a graphene/nanocrystal junction, the solar cell active layer having first and second sides;
forming an anode on the first side of the solar cell active layer; and
forming a cathode on the second side of the solar cell active layer.

20. The method of claim 1, wherein performing the electrolysis includes employing two electrodes, wherein the graphite sample is employed as one of the electrodes and a graphite rod is used as the other electrode.

21. The method of claim 1, wherein the thermal treatment includes heating the intercalated graphite using a flow of a heated inert gas.

22. The method of claim 1, wherein the electrolytic solution contains 30-50 mg/ml of the lithium perchlorate.

23. The method of claim 13, wherein the thermal process includes heating the intercalated graphite using a flow of a heated inert gas.

* * * * *